(12) United States Patent
Ichikawa et al.

(10) Patent No.: US 6,495,754 B2
(45) Date of Patent: Dec. 17, 2002

(54) HOUSING INCLUDING FIRST AND SECOND HOUSING HALVES, AND AN ARRANGEMENT FOR LOCKING THEREOF

(75) Inventors: Toshiyuki Ichikawa, Kawasaki (JP); Masanori Ohkawa, Kawasaki (JP); Hiroshi Watanuki, Kawasaki (JP); Kozo Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/863,247

(22) Filed: May 24, 2001

(65) Prior Publication Data

US 2001/0022232 A1 Sep. 20, 2001

Related U.S. Application Data

(62) Division of application No. 09/055,359, filed on Apr. 6, 1998.

(30) Foreign Application Priority Data

Sep. 30, 1997 (JP) ................................ 9-264740

(51) Int. Cl.⁷ ................................................ H02G 3/08
(52) U.S. Cl. ............................ 174/50; 174/54; 174/58; 220/3.2
(58) Field of Search ........................ 174/50, 54, 58, 174/17 R, 61, 63; 220/3.2, 3.3, 3.6, 4.01, 4.02; 248/300, 220.1, 551, 552, 553

(56) References Cited

U.S. PATENT DOCUMENTS

| | | | |
|---|---|---|---|
| 3,197,549 A | | 7/1965 | Good |
| 3,575,313 A | * | 4/1971 | Trachtenberg et al. ........ 174/58 |
| 3,928,716 A | * | 12/1975 | Marrero ........................ 174/57 |
| 3,977,640 A | * | 8/1976 | Arnold et al. ................. 174/58 |
| 4,111,390 A | * | 9/1978 | St. Jean .................... 248/220.1 |
| 4,140,293 A | * | 2/1979 | Hansen ........................ 174/58 |
| 4,186,902 A | * | 2/1980 | Simons .................. 174/163 R |
| 4,844,645 A | | 7/1989 | Rasmussen |
| 5,098,046 A | * | 3/1992 | Webb .......................... 174/48 |
| 5,349,134 A | * | 9/1994 | Russell ........................ 174/48 |
| 5,379,912 A | | 1/1995 | Wolf |
| 5,880,400 A | | 3/1999 | Leischner |
| 5,880,401 A | | 3/1999 | Leischner et al. |
| 5,927,111 A | * | 7/1999 | Nachbauer ................. 248/553 |
| 5,942,729 A | | 8/1999 | Carlson, Jr. et al. |
| 6,098,939 A | * | 8/2000 | He .............................. 174/58 |
| 6,144,562 A | * | 11/2000 | Voelzke et al. ............ 174/52.1 |
| 6,262,366 B1 | * | 7/2001 | Ichikawa et al. ............. 174/50 |
| 6,349,911 B1 | * | 2/2002 | Feldpausch et al. ........ 248/250 |

FOREIGN PATENT DOCUMENTS

| | | |
|---|---|---|
| GB | 2 126 016 | 3/1984 |
| GB | 2 160 179 | 12/1985 |
| GB | 2 257 307 | 1/1993 |

* cited by examiner

Primary Examiner—Dean A. Reichard
Assistant Examiner—Angel R. Estrada
(74) Attorney, Agent, or Firm—Staas & Halsey LLP

(57) ABSTRACT

An arragement for mounting a housing to a table. A mounting member includes a first wall adapted to be inserted into a housing and a second wall connected to the first wall and adapted to be secured to the table. The housing includes a guide for guiding the first wall into the housing. A positioning tab is provided on the second wall parallel to the first wall.

3 Claims, 26 Drawing Sheets

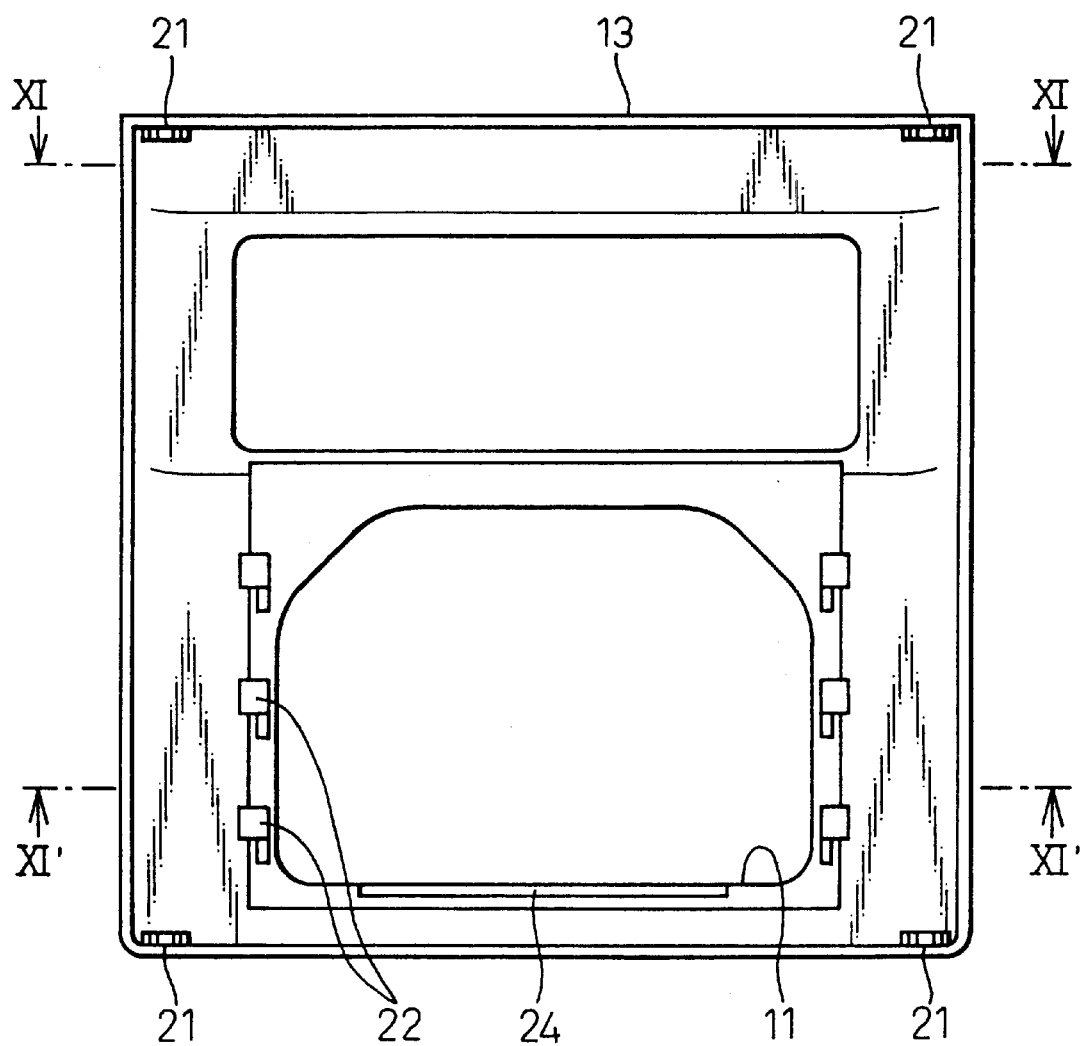

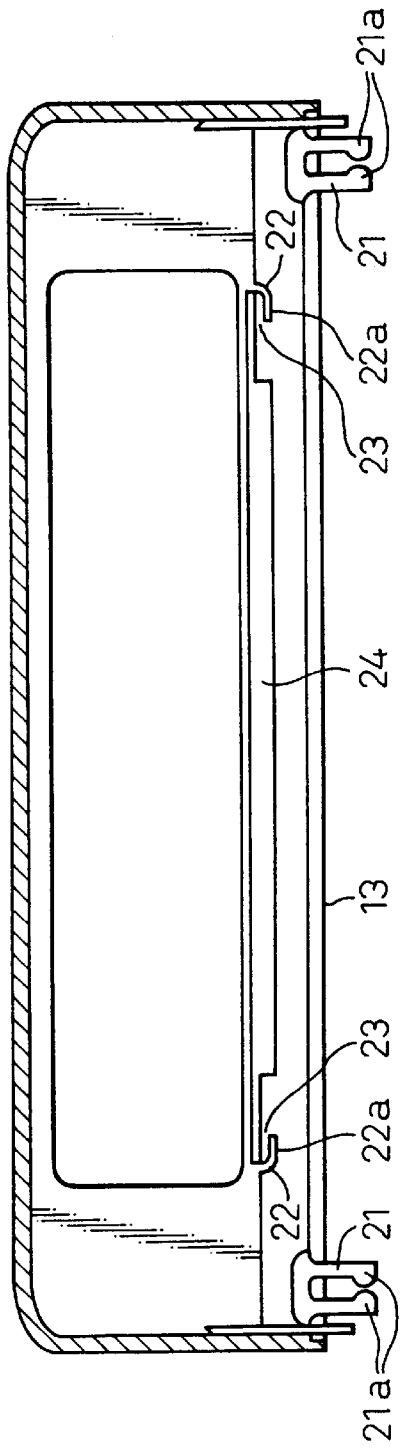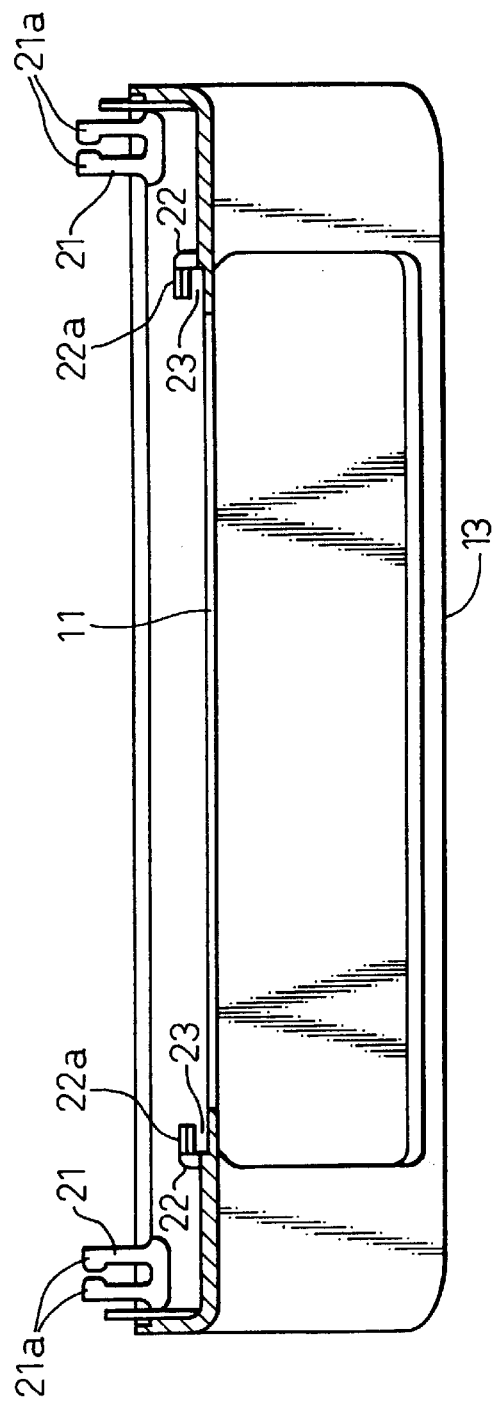

Fig.18
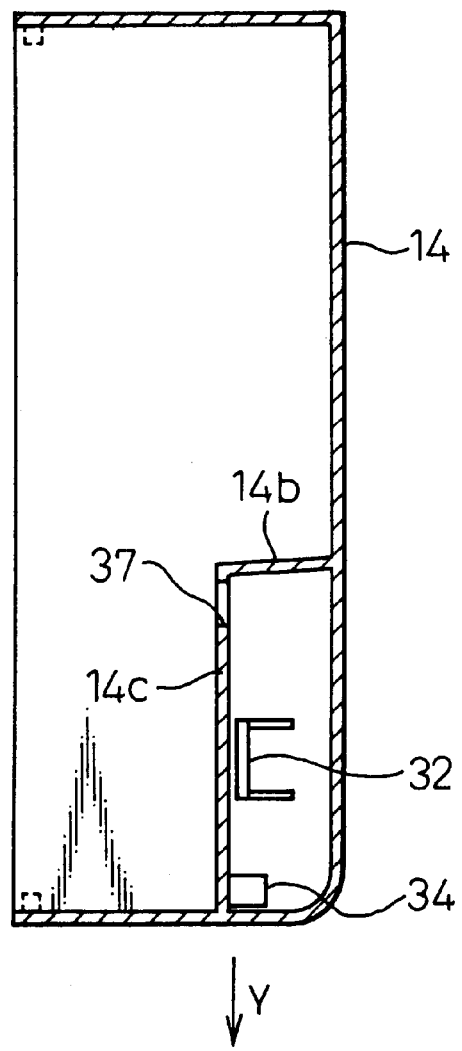
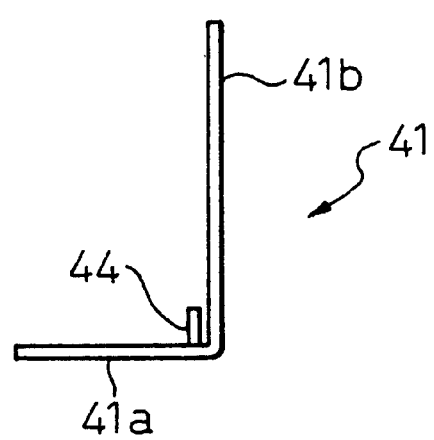

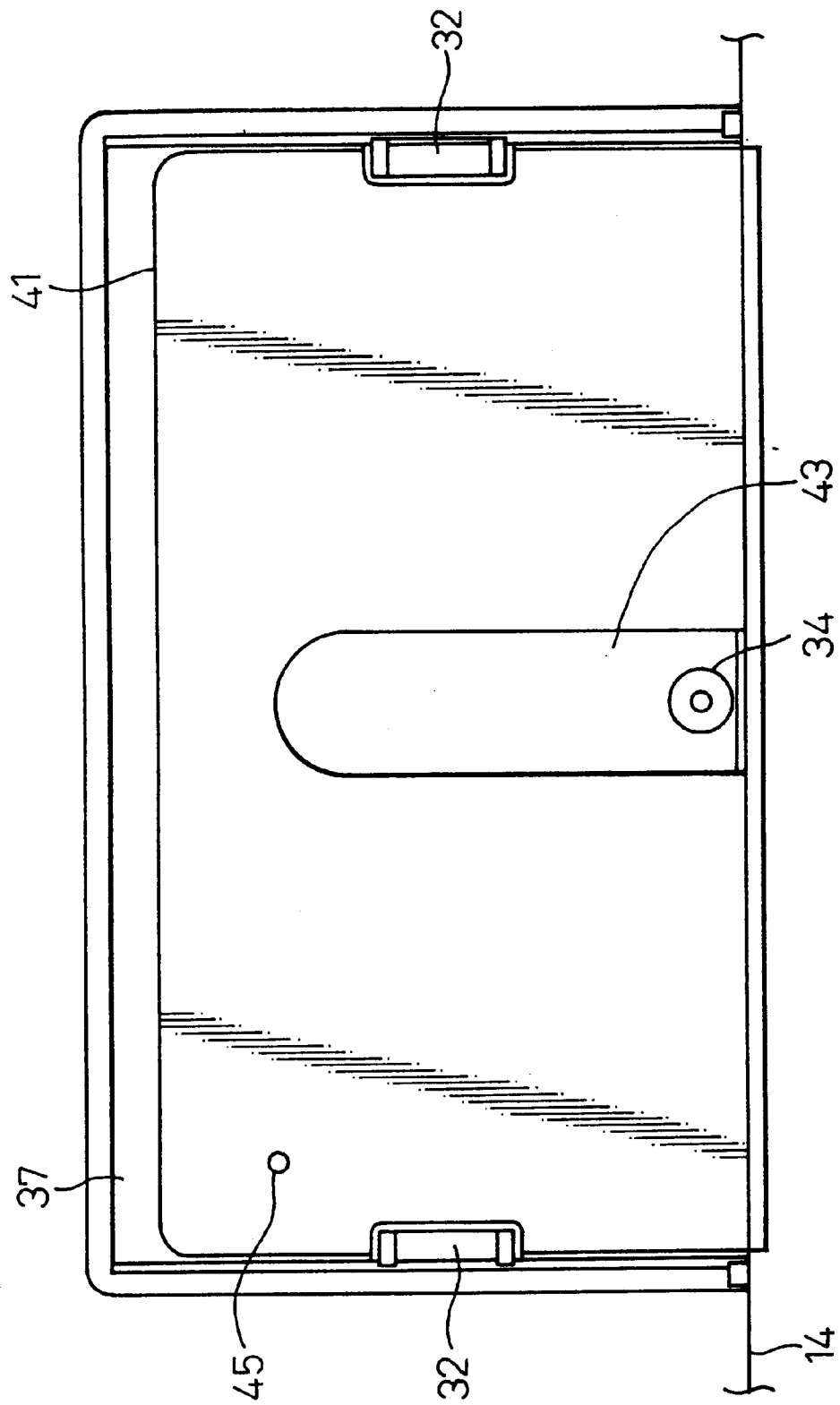

HOUSING INCLUDING FIRST AND SECOND HOUSING HALVES, AND AN ARRANGEMENT FOR LOCKING THEREOF

This application is a division of application Ser. No. 09/055,359, filed Apr. 6, 1998.

BACKGROUND OF THE INVENTION

1. Field of the Invention

The invention relates to a housing, in particular a housing for a bar code reader including first and second housing halves, and an arrangement for the locking thereof. Further, the invention relates to an arrangement for mounting the housing onto a table, and an arrangement for mounting a glass plate over an opening in the wall of the housing.

2. Description of the Related Art

There are various electronic devices enclosed by a housing of plastic material. In general, such a plastic housing includes first and second housing halves which are connected to define the housing. In order to connect and lock the housing halves to each other a locking arrangement is employed, which allows the connection of the housing halves without screws.

FIG. 26A is a partial section of a housing, and shows an example of such a locking arrangement of the prior art. In FIG. 26A, a housing 100 includes first and second housing halves 101 and 102 which connect to each other to define the housing 100. The first housing half 101 includes a recess or a groove 103 while the second housing half 102 includes a hook which engages the recess 103, as shown in FIG. 26A. The recess 103 and the hook 104 provide a locking arrangement so that the first and second housing halves 101 and 102 are locked to each other through the engagement.

The locking arrangement of the prior art shown in FIG. 26A allows a person to assemble the housing easily. On the other hand, in order to disengage the hook 104 from the recess 103 during disassembling, it is necessary to depress the edge of the second housing 102 around the hook 104 as shown by arrow A, or to pull the edge of the first housing 101 around the recess 103 as shown by arrow C. In order to carry out such a work, a tool such as a driver must be used. Further, it is difficult work to move one of the first and second housing halves 101 and 102 away from the other with the edges depressed or pulled. Thus, in the locking arrangement of the prior art, during disassembling for maintenance, difficult and time consuming work is inevitable.

Further, an error in the dimensions of the housing or the locking arrangement makes impossible to connect and secured the housing halves to each other. FIG. 26B shows a case in which the first housing half 101 is made larger than the designed dimension so that the hook 104 cannot engage the recess 103 sufficiently. Furthermore, in general, an elongated recess is not provided so that the recess must be accurately disposed at a position corresponding to the hook 104. Thus, the relative position between the recess and the hook is critical so that an error in the position also makes it possible to connect and secured the housing halves to each other.

SUMMARY OF THE INVENTION

The invention is directed to solve the above mentioned prior art problems, and the objective of the invention is to provide an arrangement, for locking first and second housing halves of a housing, which is improved to make it possible to easily connect and disconnect the first and second housing halves.

Further, the objective of the invention is to provide an arrangement, for locking first and second housing halves of a housing, which is improved to ensure the locking action in spite of an error in the dimensions of the housing halves or in the position of the locking arrangement.

According to the invention, there is provided an arrangement for locking first and second housing halves to each other. The arrangement comprises a pin provided on the first housing, and a locking member with a pair of arms which are provided on the second housing to engage and hold the pin when the first and second housings are connected.

The arms preferably define an engagement surface to mate with the outer surface of the pin.

Further, there is provide a housing which comprises first and second housings adapted to connect to each other, a pin provided on the inner surface of the first housing, and a locking member with a pair of arms which are provided on the inner surface of the second housing to engage and hold the pin when the first and second housings are connected.

The arrangement of the invention enables the housing halves to be connected and disconnected easily. Moreover, the arrangement of the invention ensures the locking action in spite of an error in the dimensions of the housing halves.

Further, there is provided an arrangement for mounting a housing to a table. The arrangement comprises a mounting member which includes a first wall adapted to be inserted into the housing and to be secured to the housing, and a second wall adapted to be secured to the table. The first and second walls are connected to each other. A guide is provided in the housing for guiding the first wall inserted into the housing.

The first and second walls are preferably connected perpendicularly to each other. The mounting member may include a positioning tab provided on the second wall parallel to the first wall which is inserted to an opening in the housing.

Further, there is provided an arrangement for mounting a glass plate over an opening provided in a wall of a housing. The arrangement comprises a plurality of catches, proved on the surface of the housing along the periphery of the opening, for clamping a glass plate mounted over the opening, the catches including flexible ends extending over the wall of the housing, the flexible ends resiliently deforming, when the glass plate is mounted over the opening, to press the glass plate onto the wall of the housing. A stopper is provided on the wall of the housing along the periphery of the opening, the stopper abutting the lower end of the glass plate to support it when the glass plate is mounted over the opening.

DESCRIPTION OF THE DRAWINGS

These and other objects and advantages and further description will now be discussed in connection with the drawings in which:

FIG. 3 is a back view of the front housing illustrating the inner surface of the front housing;

FIG. 6A is a section of the front housing along XI—XI in FIG. 3;

FIG. 6B is a section of the front housing along XI'—XI' in FIG. 3;

FIG. 18 is a exploded side section of the housing, illustrating the installation of the housing to a table;

FIG. 21 is an enlarged elevation of the mounting member inserted into the guide gap in the recess of the rear housing;

DESCRIPTION OF THE PREFERRED EMBODIMENTS

With reference to the drawings, the preferred embodiment of the invention will be described.

Figure 1:
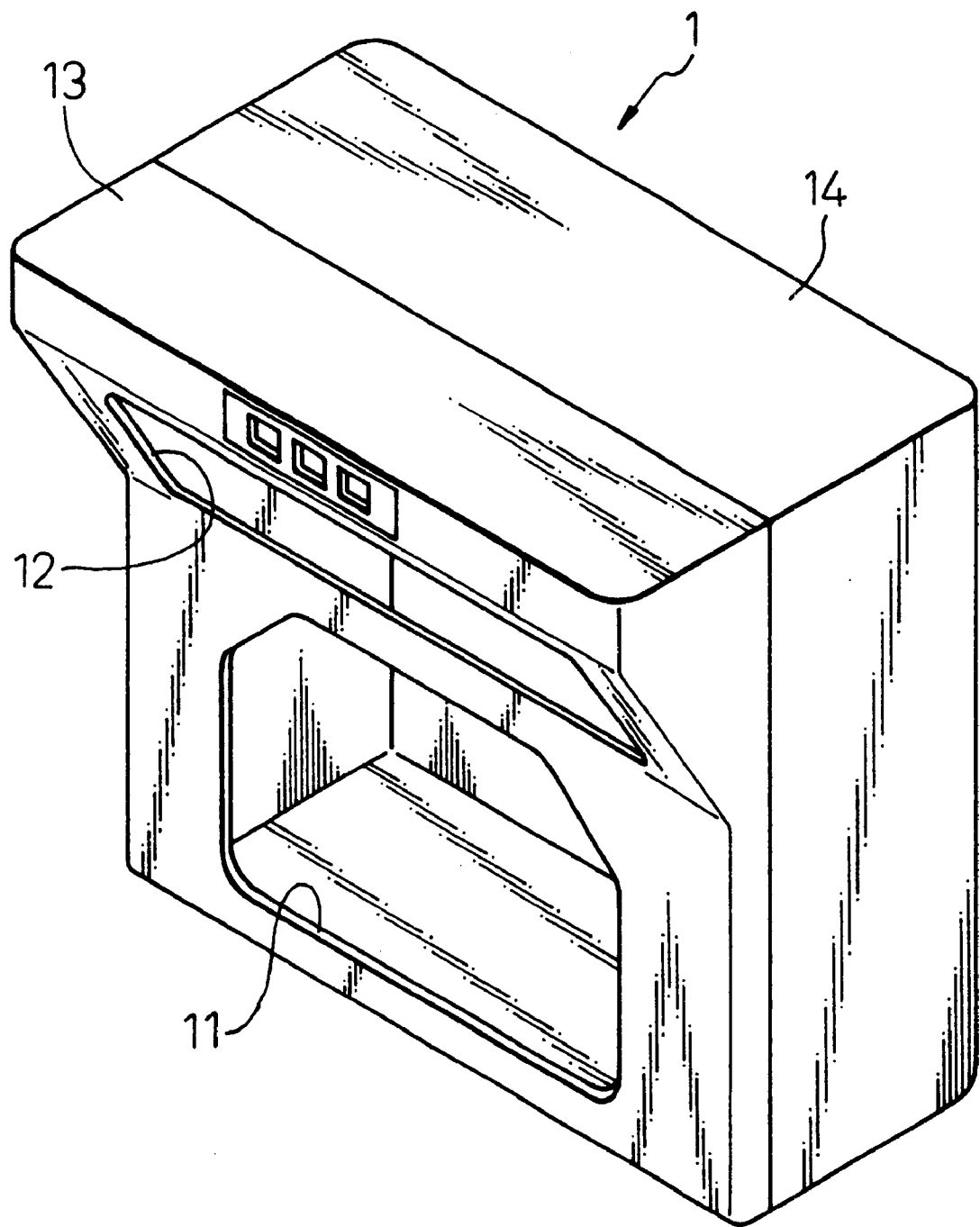
FIG. 1 is a perspective view of a housing according to the embodiment of the invention.

FIG. 1 is a perspective view of a housing 1 according to the embodiment of the invention. The housing 1 is used for a bar code reader, as an example. In particular, the housing 1 is advantageously used for a fixed type bar code reader which is secured to a top of a table such as a cashier's counter.

A bar code reader is a device for reading a bar code applied onto an article. The bar code reader shown in FIG. 1 is secured to a cashier's counter and reads a bar code on an article which an operator passes in front of the bar code reader. The bar code reader is useful to read bar codes on a number of articles in a short time.

The fixed type bar code reader includes a light source such as a laser diode, a scanning means such as a polygon mirror or a galvano-mirror for reflecting and scanning the beam from the light source, at least one mirror for reflecting the scanning beam from the scanning means, a photo-sensor for receiving the beam reflected by a bar code, and a decoding means for decoding the bar code based on an electrical signal from the photo-sensor, which are enclosed within a housing. The housing includes a window through which the scanning beam propagates toward an article and the beam reflected from the bar code enter the reader.

The housing 1 includes first and second windows 11 and 12 to provide a multi-scanning type bar code reader. The multi-scanning type bar code reader propagates two separate scanning beams to a bar code in different directions. This ensures the reading of a bar code even if an operator does not orient the bar code accurately to the windows since one beam through one of the windows should scan the bar code. Thus, in the multi-scanning bar code reader, the reading error is reduced and reading efficiency is improved compared with a bar code reader with a single window.

The housing 1 shown in FIG. 1 includes front and rear housings 13 and 14, as first and second housing halves, connected to each other. The first and second windows 11 and 12 are provided in the front wall of the front housing 13. The front and rear housings 13 and 14 can be formed of resin molding.

Figure 2A:
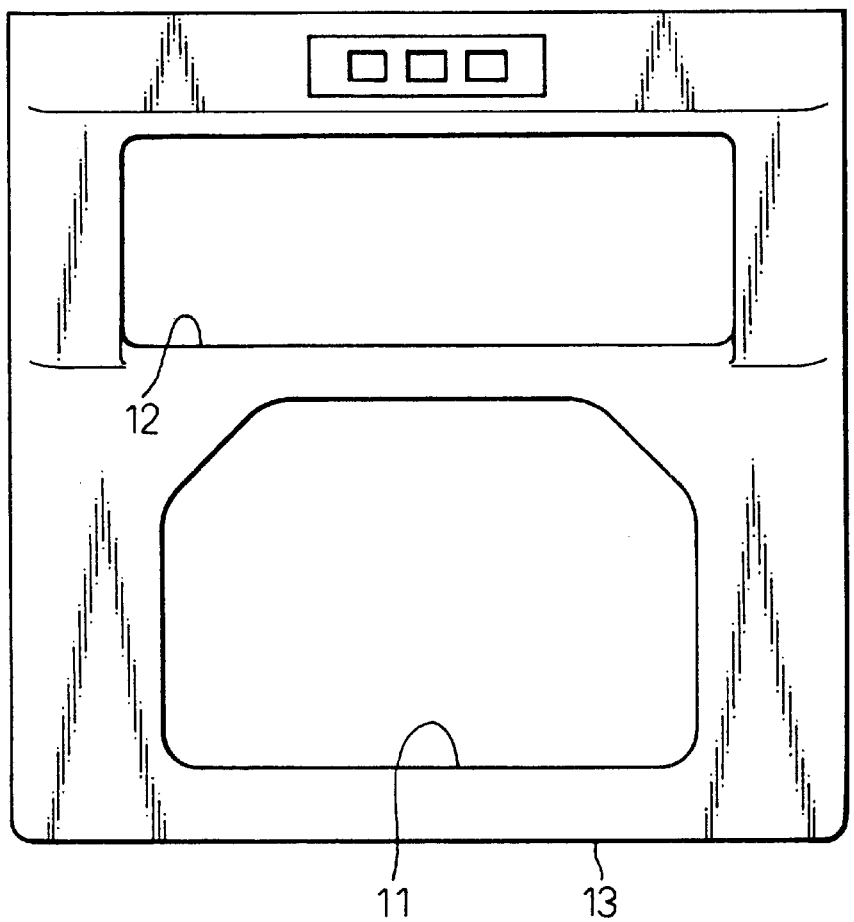
FIG. 2A is a front view of the front housing.
Figure 2B:
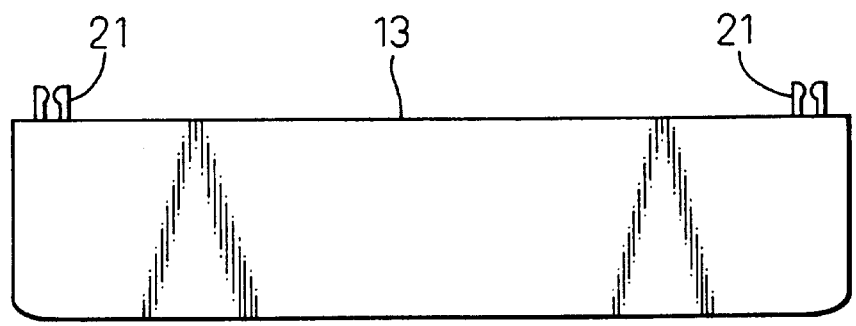
FIG. 2B is a top view of the front housing.

FIGS. 2A and 2B are front and top views of the front housing 13, respectively. FIG. 3 is a back view of the front housing in which a glass plate 61 is mounted over the first window 11 by and secured six catches 22.

Figure 4:
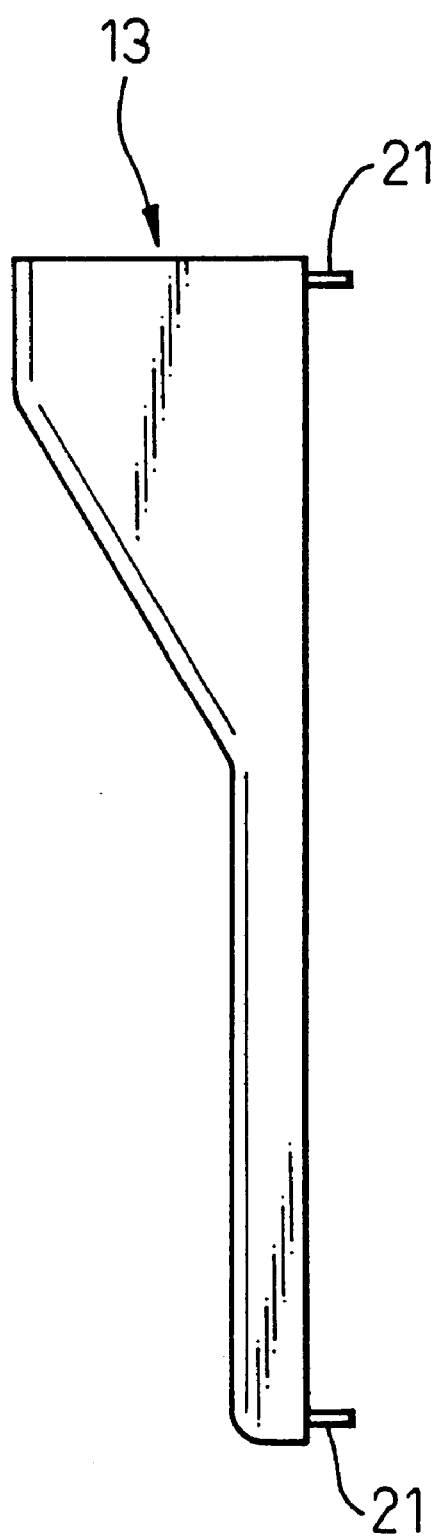
FIG. 4 is a side view of the front housing.
Figure 5:
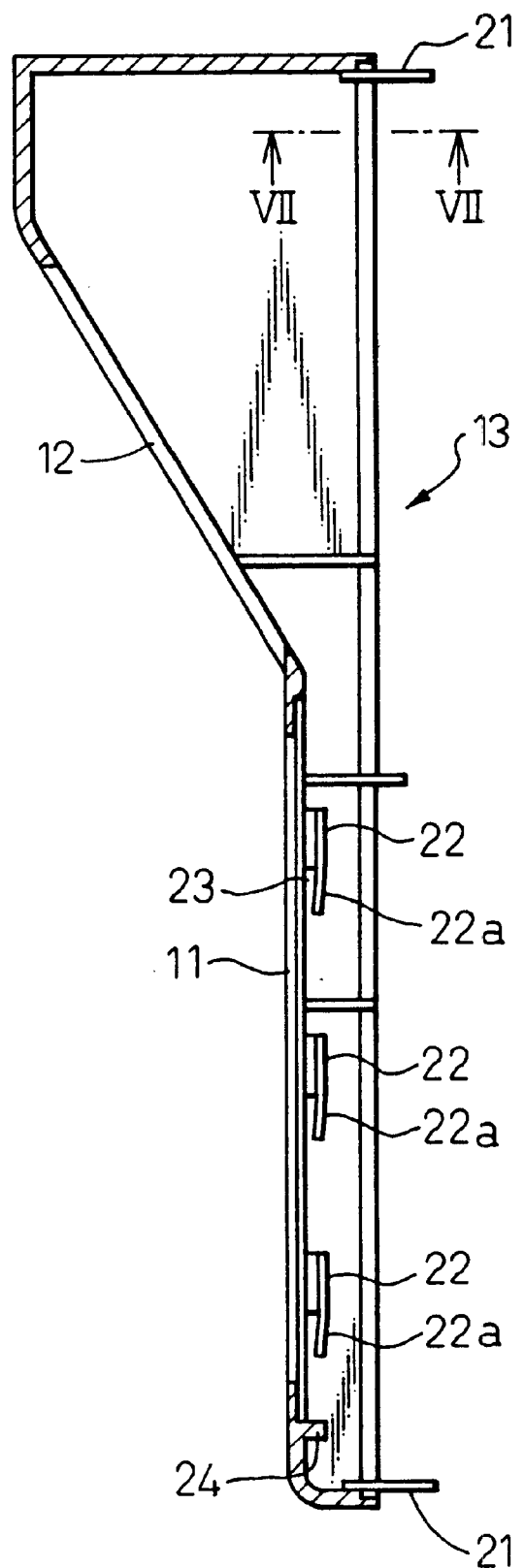
FIG. 5 is a longitudinal section of the front housing.

Locking members 21, for connecting and locking the rear housing 14 to the front housing 13, are provided on the inner surface the front housing 13 at four corners thereof. The catches 22 and the locking members 21 are each formed as one piece with the front housing 13. FIGS. 4 and 5 are a side view and a longitudinal section of the front housing 13, respectively. The locking members 21 are attached to the inner surfaces of the top and bottom walls of the front housing 13.

The catches 22 are disposed along the vertical sides of the first window 11. With reference to FIGS. 6A and 6B, the catches 22 have flexible ends 22a which are formed to provide spaces 23, into which the glass plate 61 is received, between the front wall of the front housing 23 and the ends 22a of the catches 22. The front housing 23 further includes a stopper 24 for supporting the glass plate 61 by abutment with the bottom end of the glass plate 61.

As shown FIGS. 6A and 6B, the locking members 21 have pairs of arms 21a between which engagement pins 36 and 36' (FIGS. 14A, 14B, 15A and 15B) are received as described hereinafter.

Figure 7A:
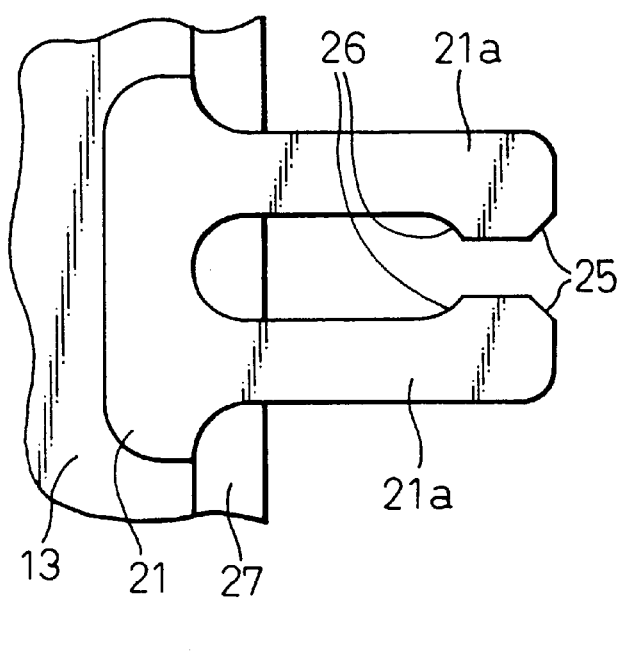
FIG. 7A is a plan view of the locking member viewing from line VII—VII in FIG. 5.
Figure 7B:
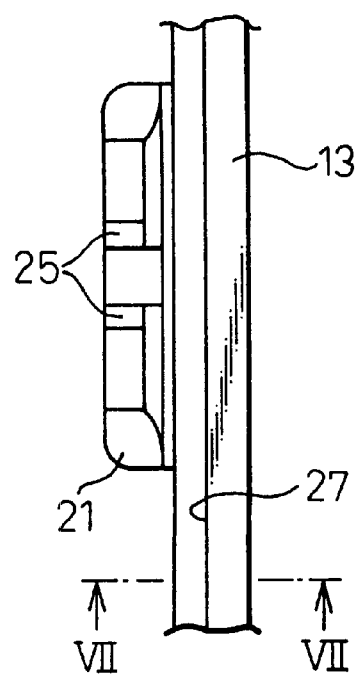
FIG. 7B is a front view of the locking member.
Figure 7C:
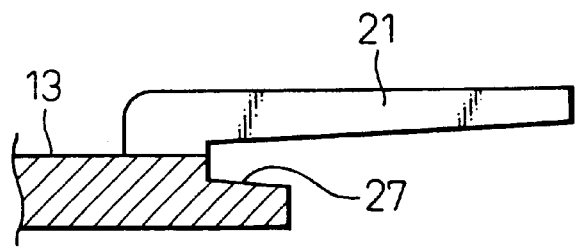
FIG. 7C is a side view of the locking member.

FIGS. 7A, 7B and 7C are plan, front and side views of the locking member 21, respectively. The locking members 21 include cutout portions 25, at the distal end of the arms 21a, for facilitating the introduction of the engagement pins 36 between the arms 21a, and engagement surfaces 26 inside of the arms 21a.

The front housing 13 further includes undercut 27, along the edges of the both sides, top and bottom walls of the front housing 13. Fitted to the undercut 27 is edged portion 14a extending along the inner edge of the rear housing 14.

Figure 8:
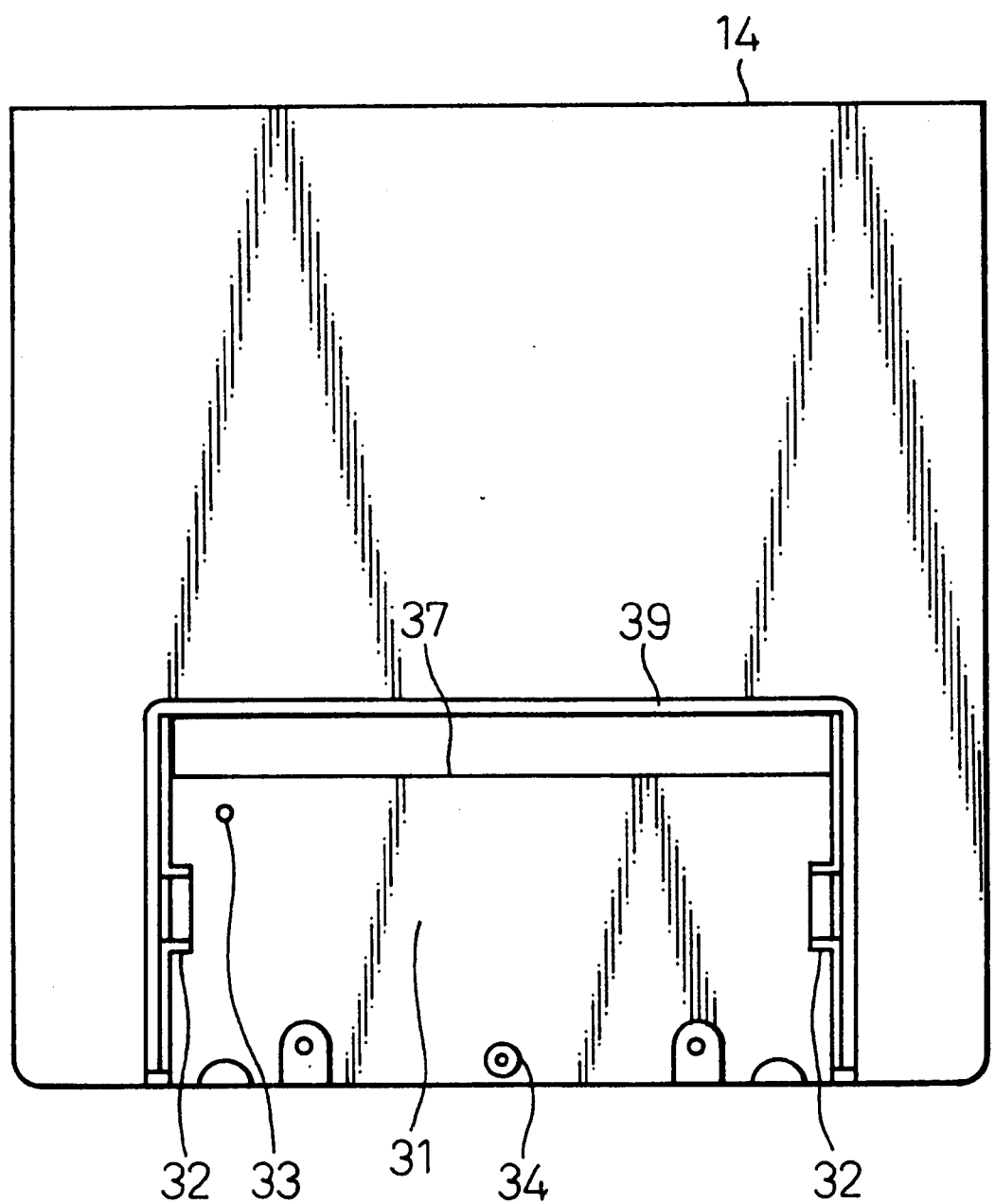
FIG. 8 is a back elevation of the rear housing.
Figure 9A:
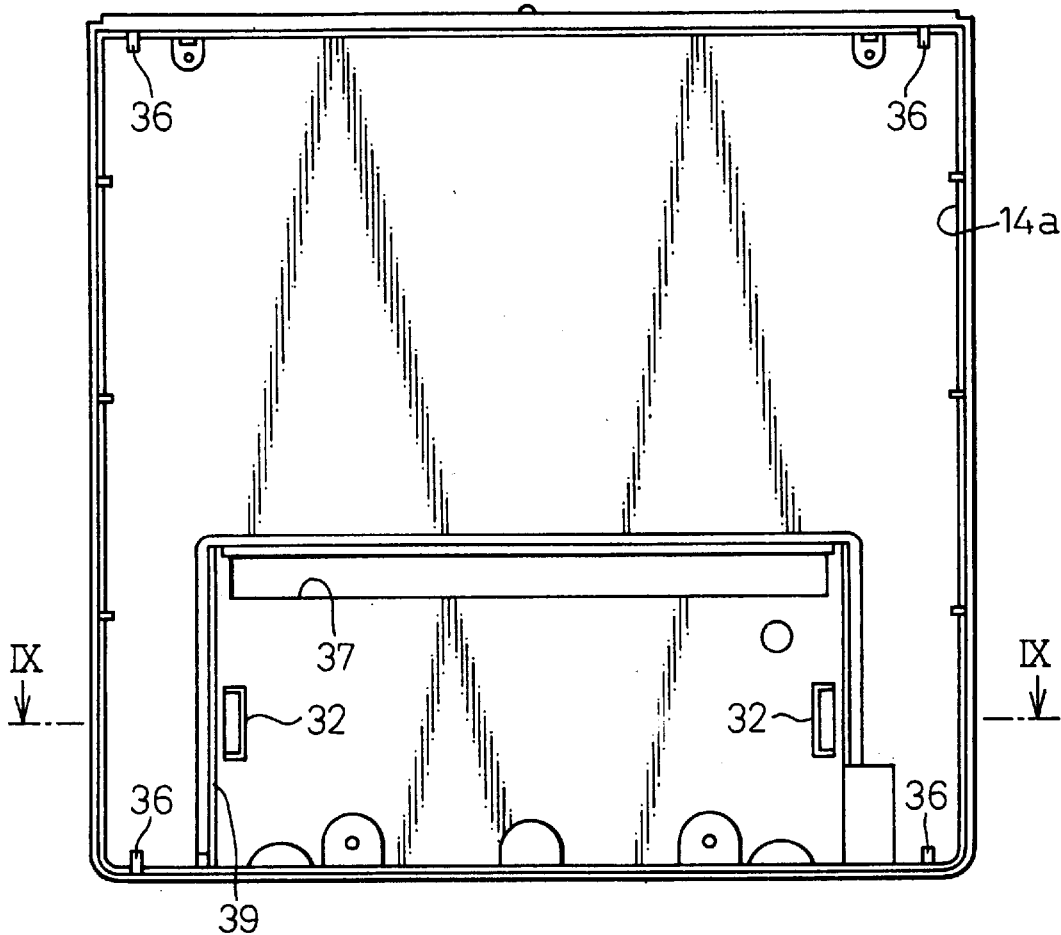
FIG. 9A is a front elevation of the rear housing, illustrating the inside of the rear housing.
Figure 9B:
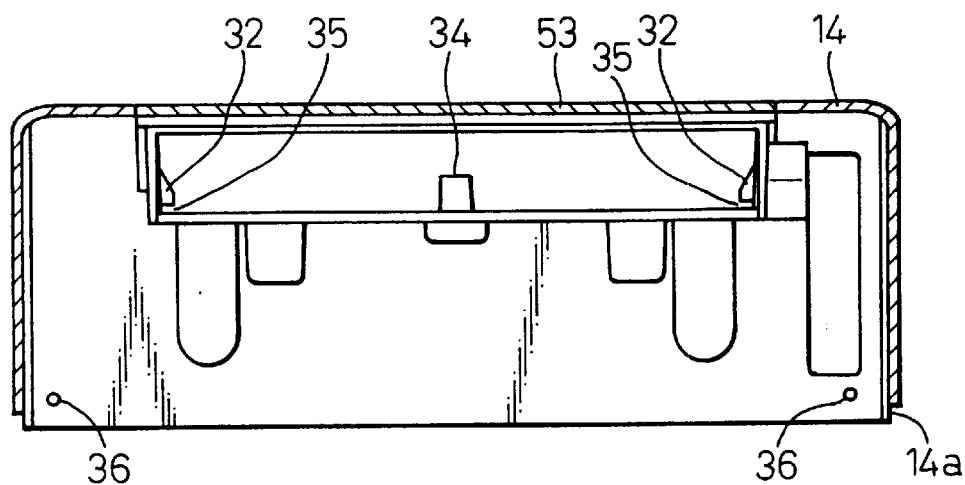
FIG. 9B is a section along IX—IX in FIG. 9A.

FIG. 8 is a back elevation of the rear housing 14. FIG. 9A is a front elevation of the rear housing 14 illustrating the inside of the rear housing 14. FIG. 9B is a section along IX—IX in FIG. 9A.

Figure 22:
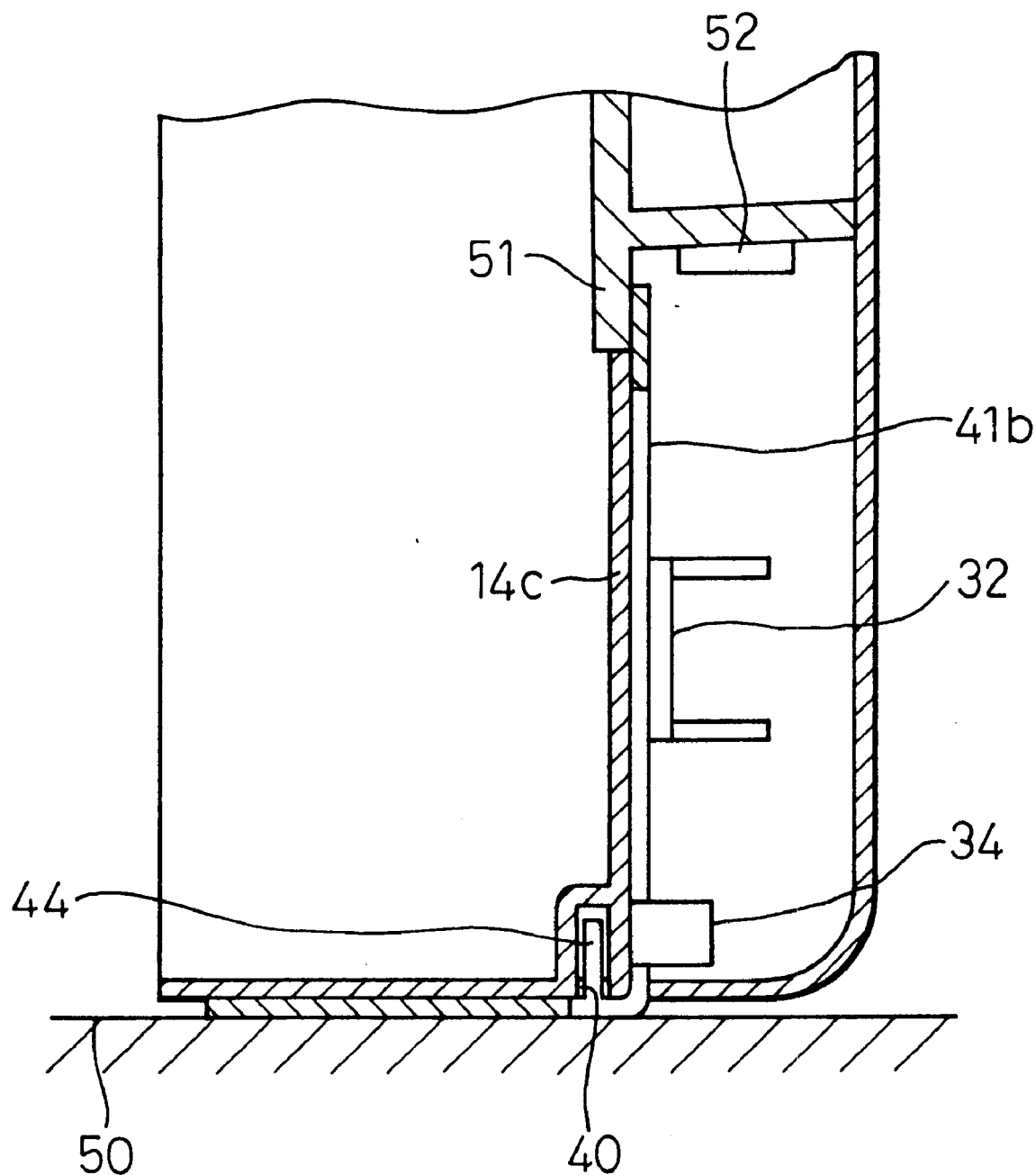
FIG. 22 is a partially enlarged side section of the bottom portion of the rear housing illustrating the insertion of the mounting member.

The rear housing 14 includes partitions 14b and 14c defining a recess 31 for containing a cable and connector assembly (not shown) for transmitting an electrical signal corresponding to a bar code read by the bar code reader to an outside mainframe (not shown). The recess 31 includes a back opening 39, for accessing the cable and connector assembly, in the back and bottom walls of the rear housing 14. In FIG. 22, only a connector 52 is shown. The back opening 39, except for the portion defined in the bottom wall of the rear housing 14, is closed by a back cover 53 (FIGS. 9, 23) attached over the opening 39 by a screw which are threaded into a boss 34 with a threaded bore. In particular, referring to FIG. 23, the rear housing 14 and the back cover 53 define a slit 55 in the bottom of the rear housing 14 for the insertion of the mounting member 41 as described hereinafter. The partition 14c includes an opening 37 for extending the cable.

Figure 10:
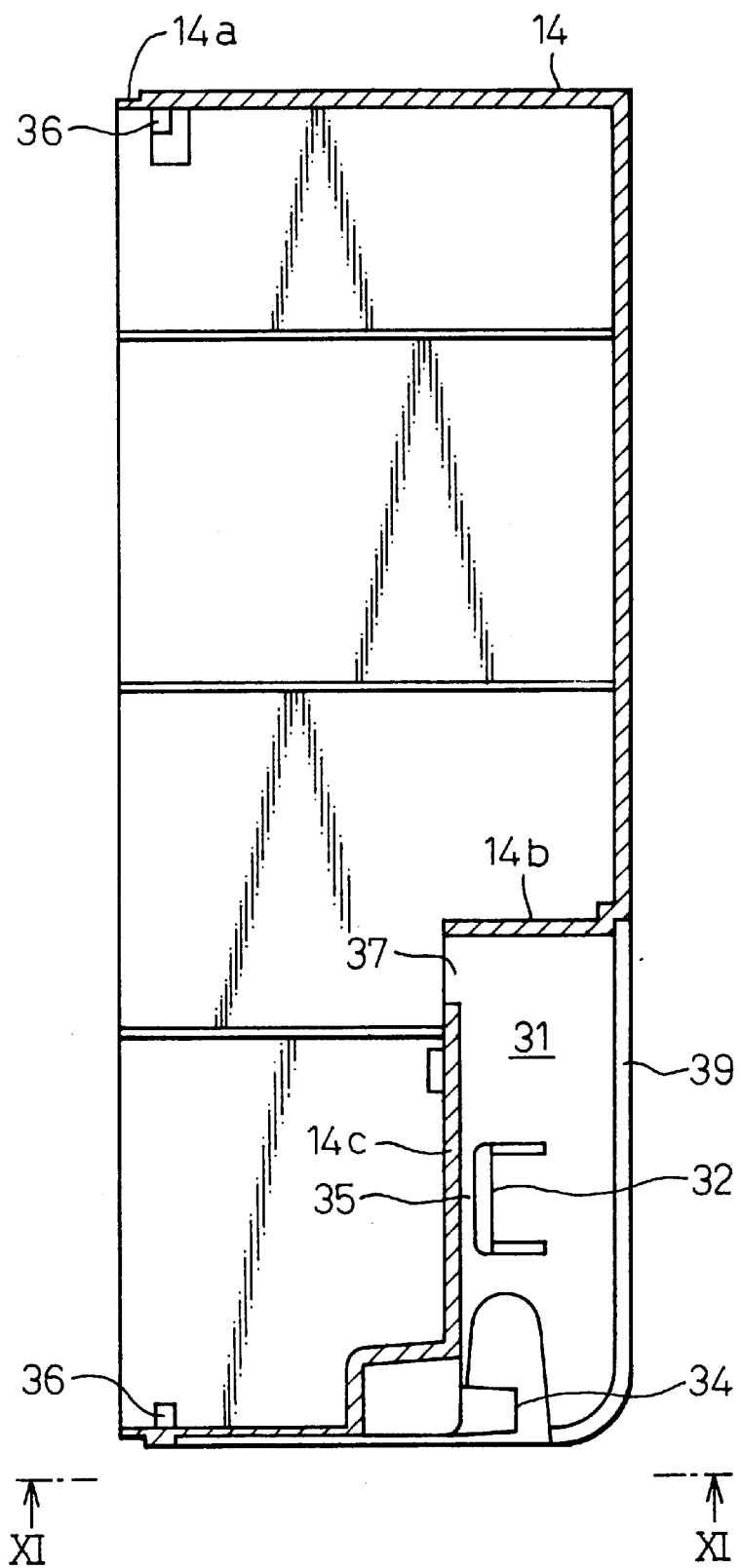
FIG. 10 is a side section of the rear housing.

With reference to FIG. 10, which is a side section of the rear housing 14, within the recess 31, a pair of guide members 32 are provided to define guide gaps 35 between the guide members 32 and the vertical partition 14c. A mounting member 41 (FIG. 16) is inserted in the guide gaps 35 through the slit 55 as described hereinafter.

Figure 11:
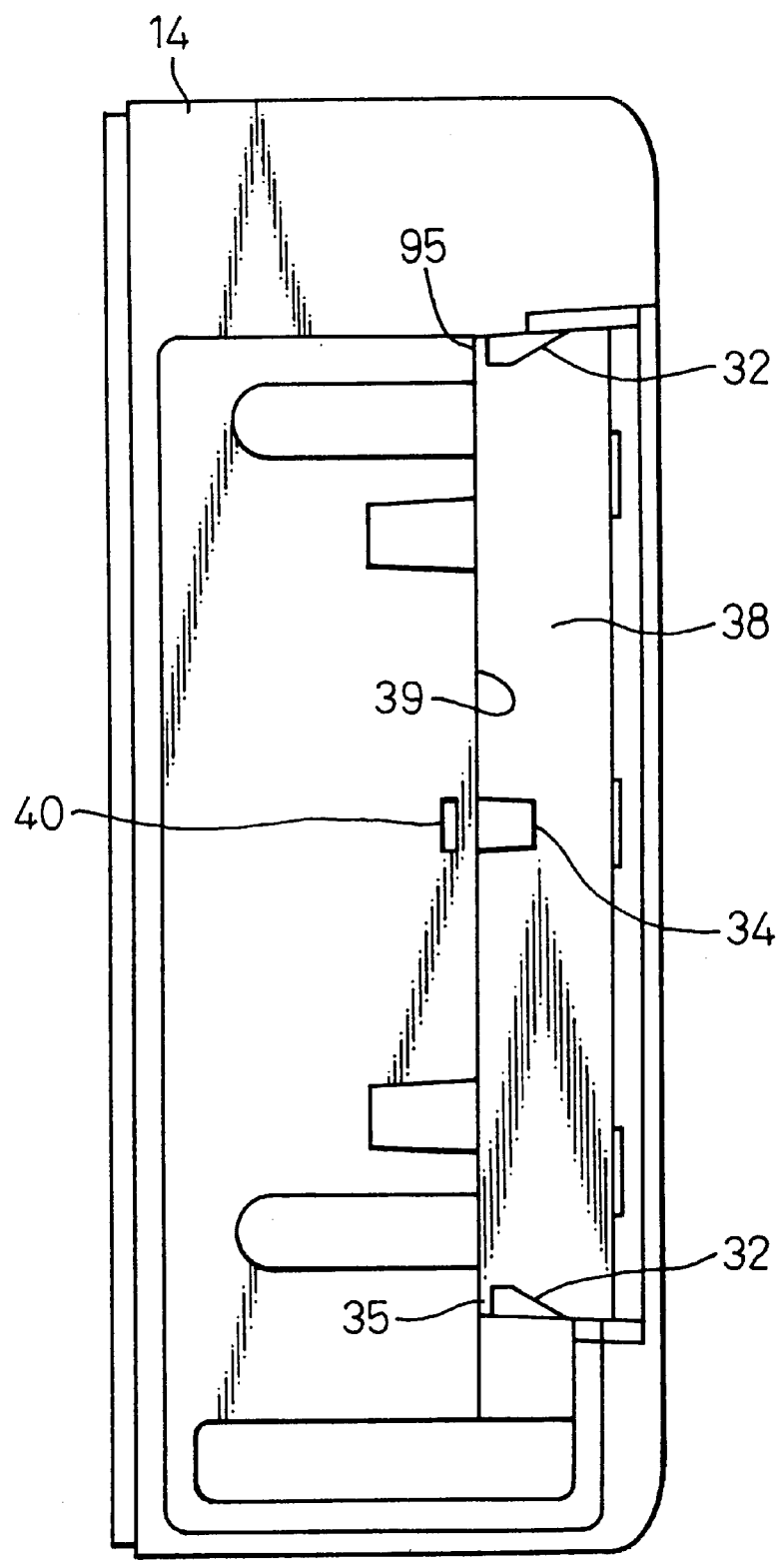
FIG. 11 is a bottom view of the rear housing.
Figure 16:
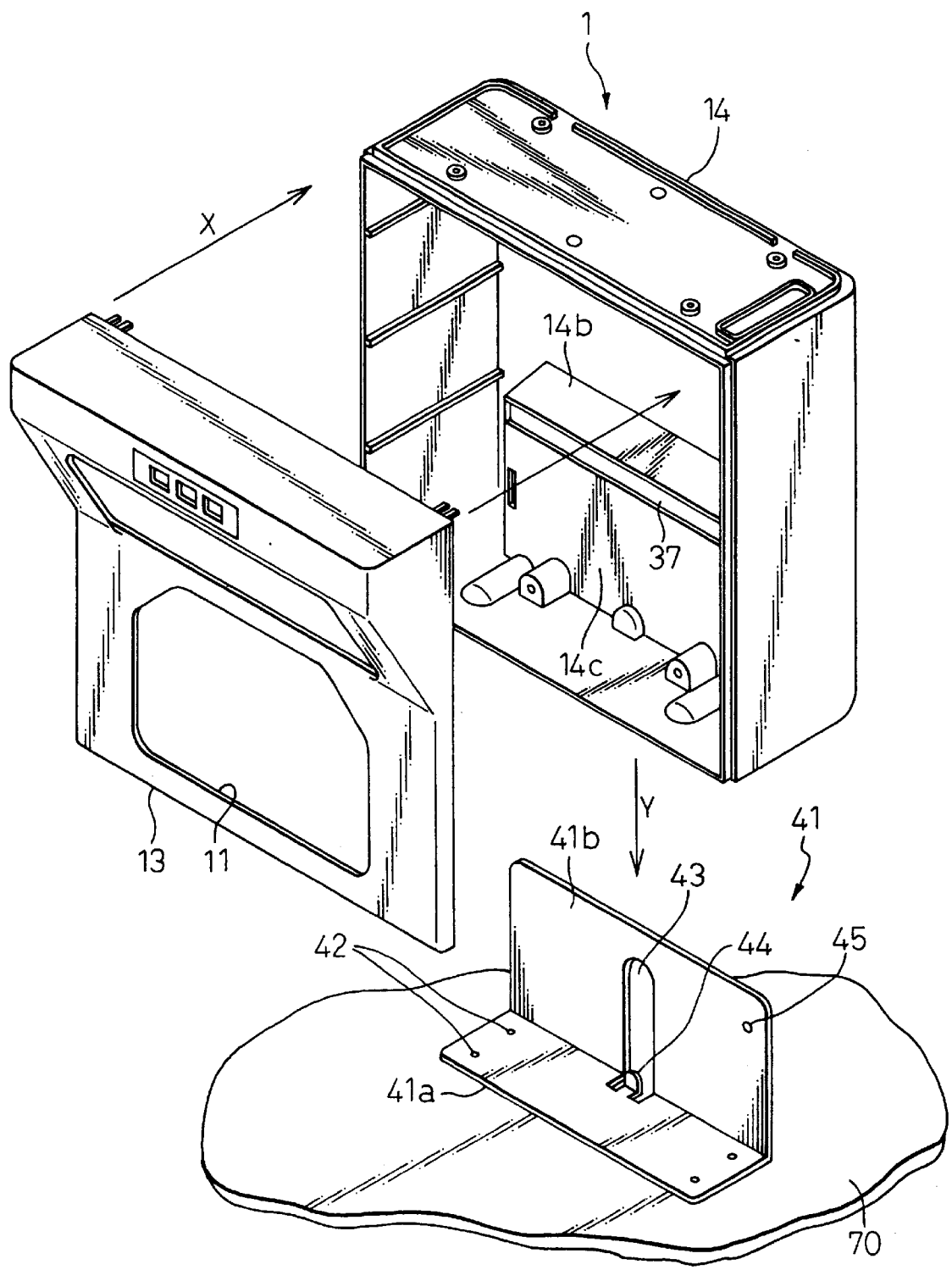
FIG. 16 is a exploded perspective view of the housing according to the embodiment of the invention, illustrating the installation of the housing to a table.
Figure 17:
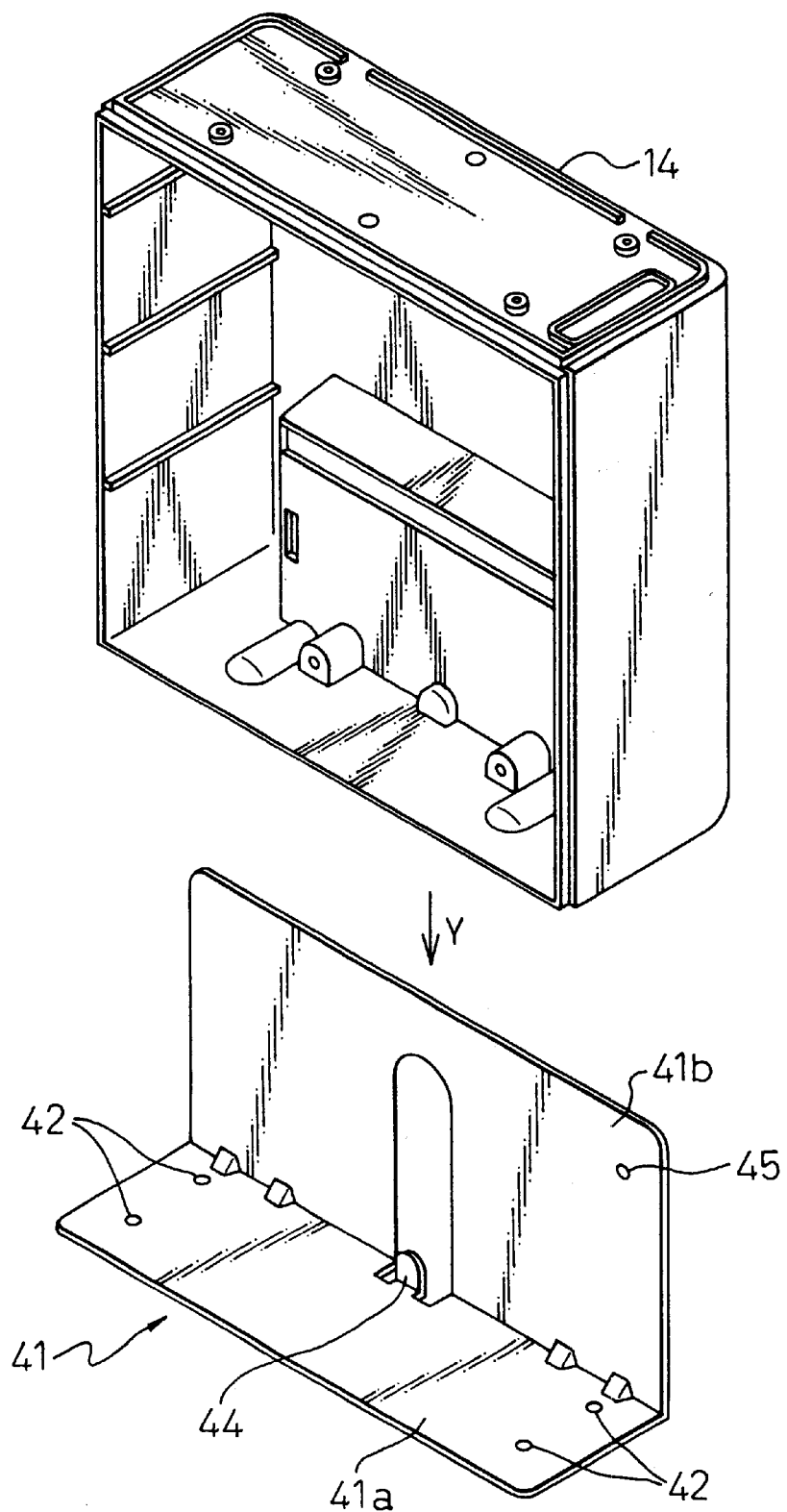
FIG. 17 is a exploded perspective view similar to FIG. 16, however, the front housing is not shown.
Figure 19:
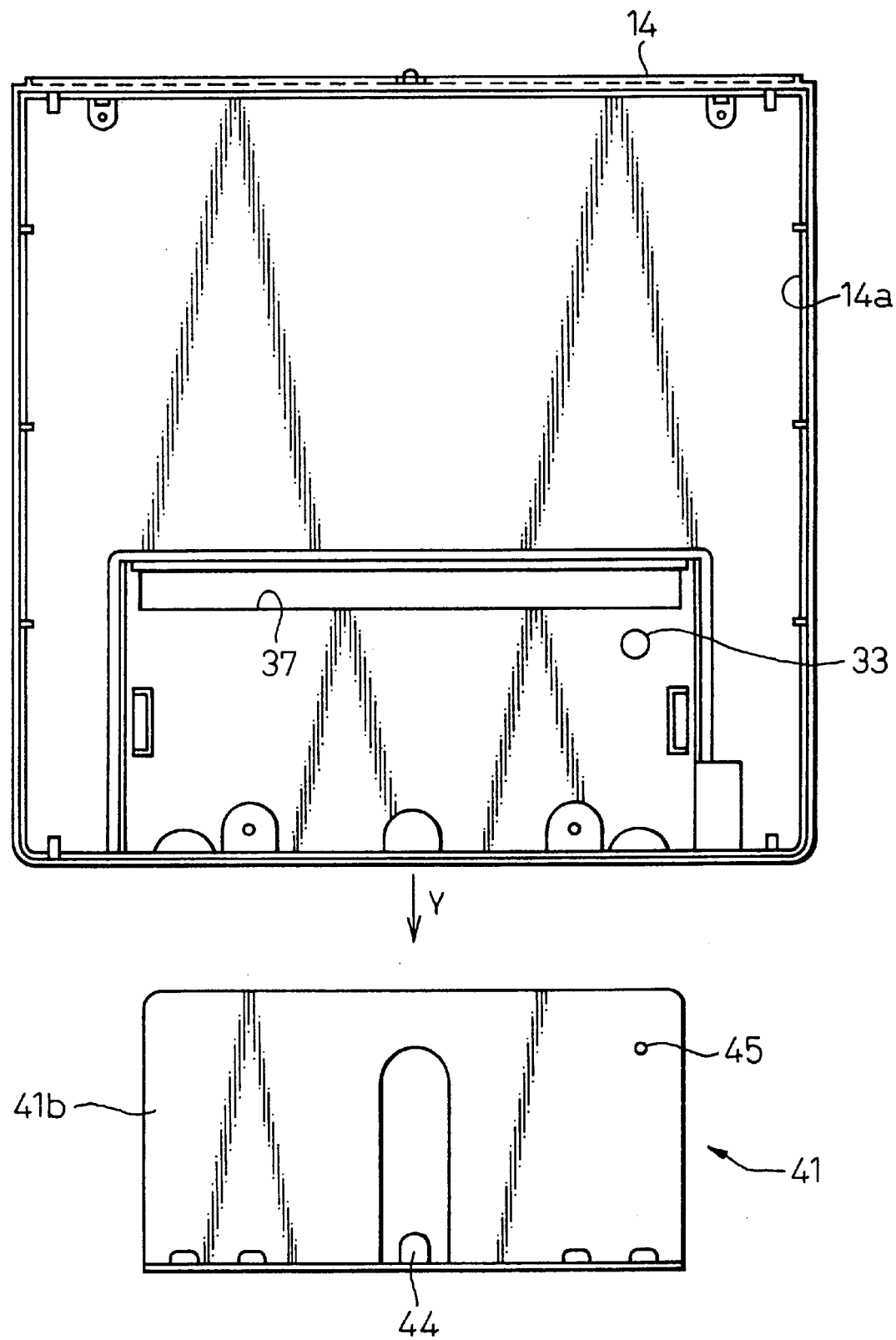
FIG. 19 is a exploded front view of the rear housing, illustrating the installation of the housing to a table.
Figure 20A:
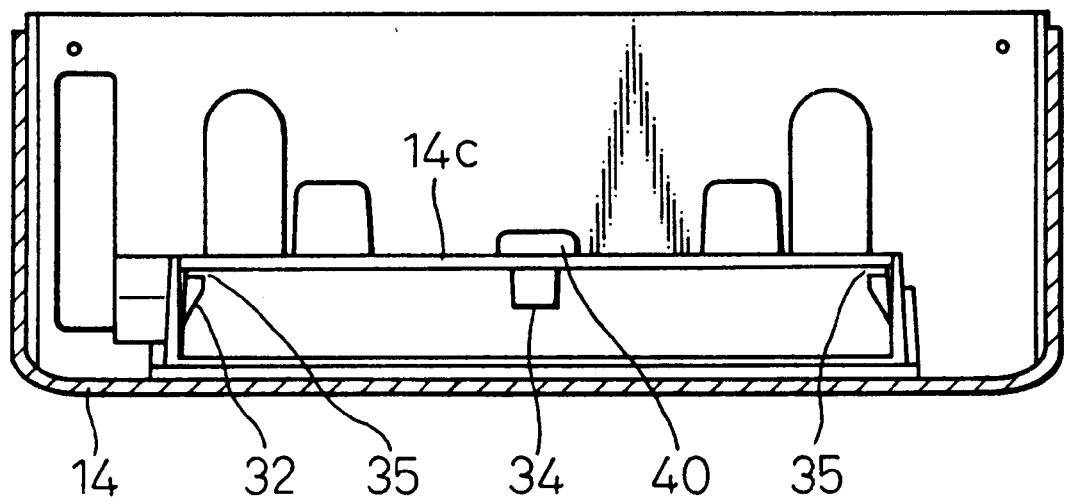
FIG. 20A is a top section of the rear housing.
Figure 20B:
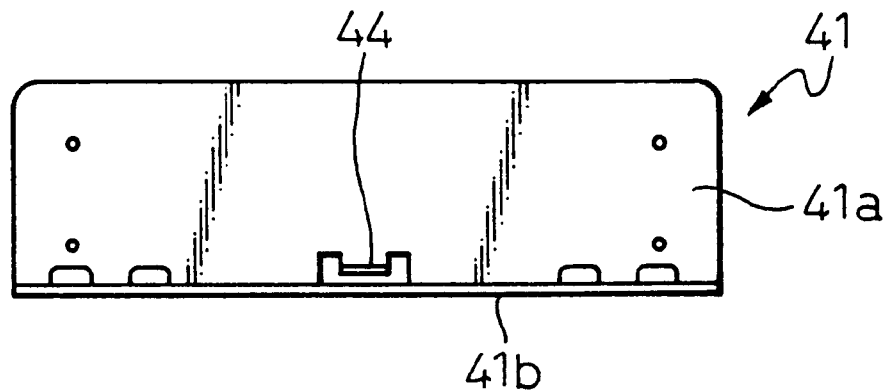
FIG. 20B is a top view of the mounting member.

FIG. 11 is a bottom view of the rear housing 14 seen from line XI—XI in FIG. 10. A rectangular opening 40 is provided in the bottom wall of the rear housing 14 adjacent to the opening 31 for receiving a positioning tab 44 of the mounting member 41 (FIG. 16).

Figure 12:
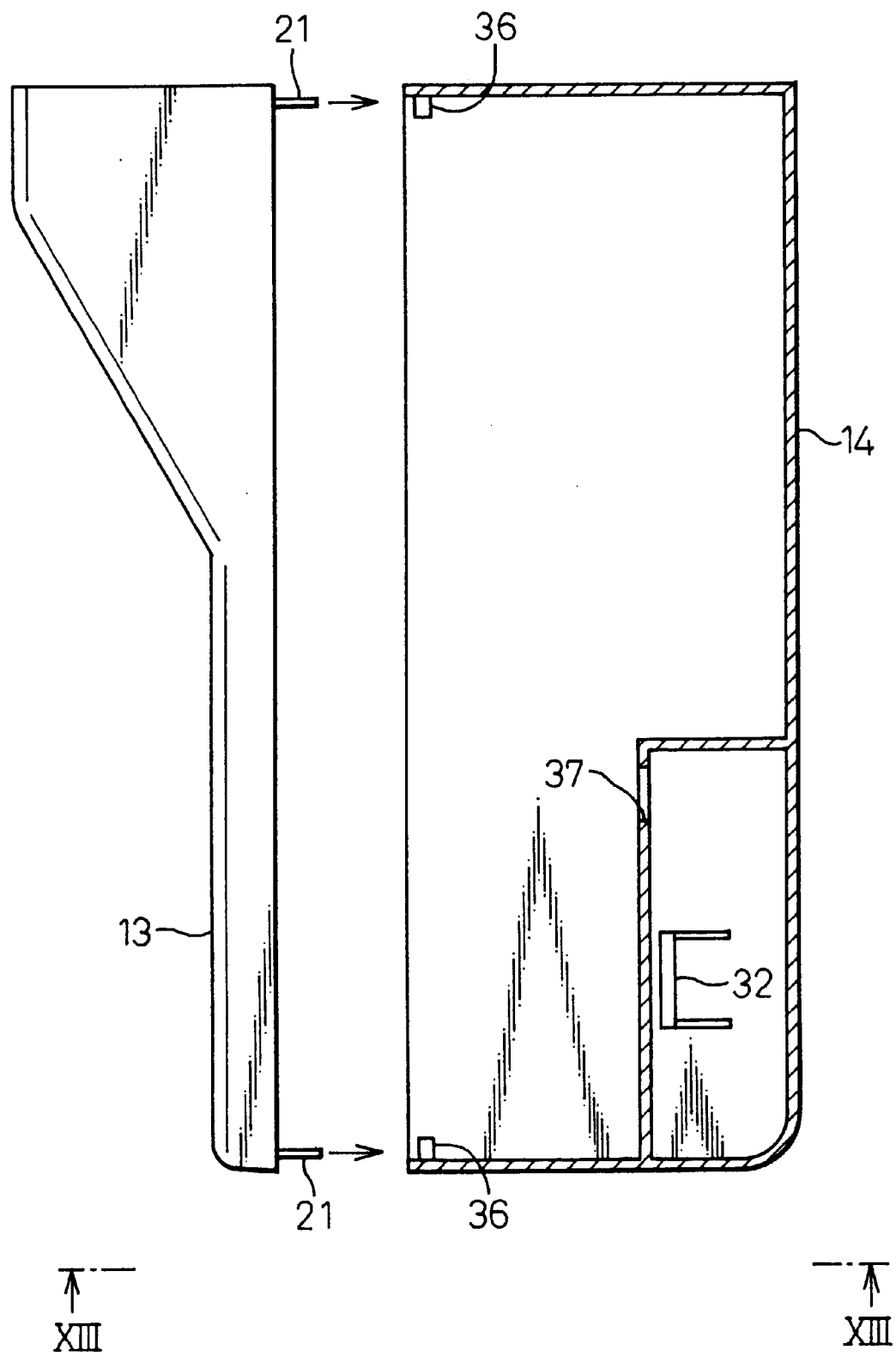
FIG. 12 is a side view of the housing, in which the front and rear housings will be connected to each other.
Figure 13:
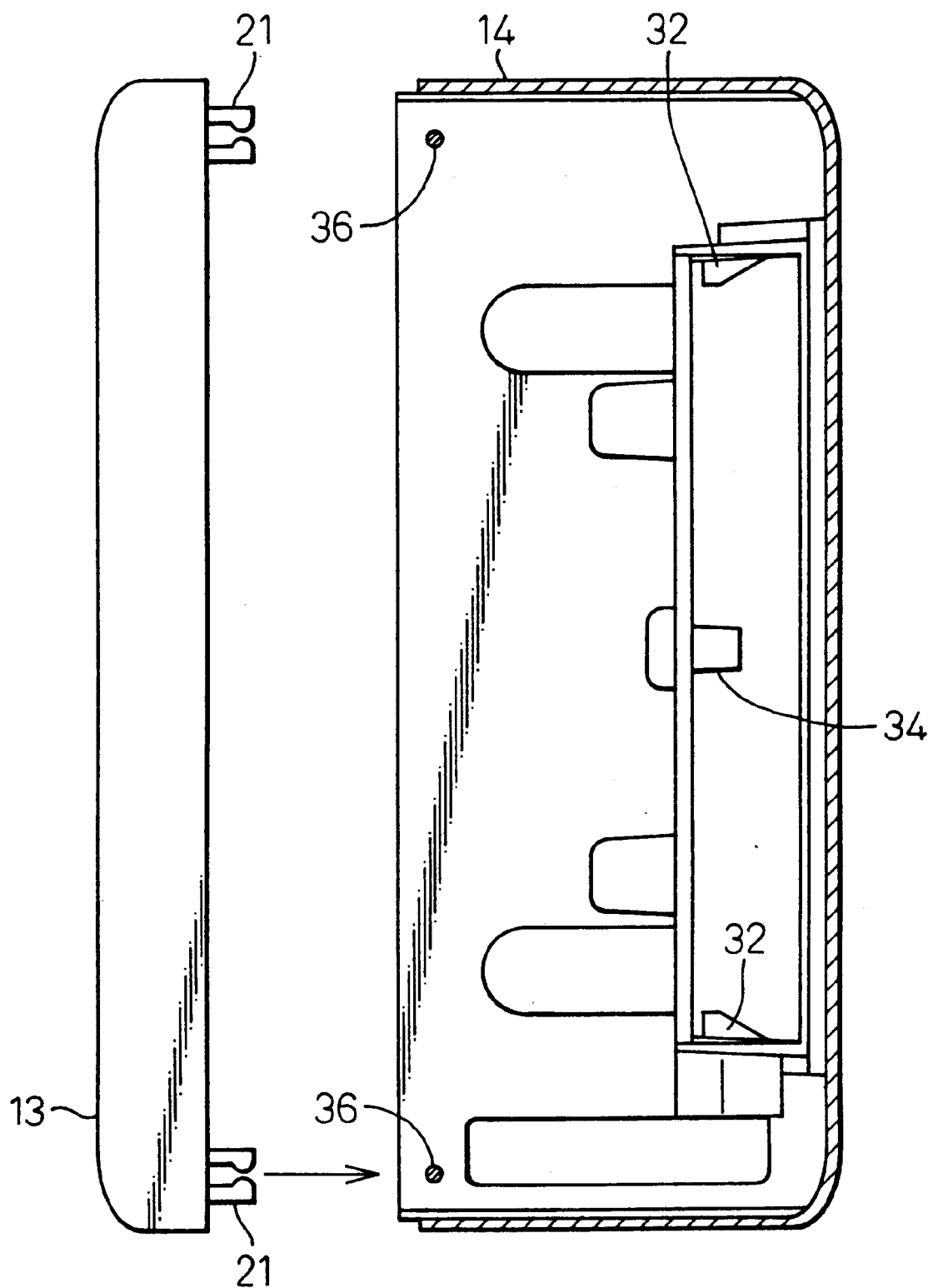
FIG. 13 is a bottom view of the housing, in which the front and rear housings will be connected to each other.

FIGS. 12 and 13 are side and bottom views of the housing 1, respectively, in which the front and rear housings 13 and 14 are to be connected to each other. In order to show engagement pins 36, rear housing 14 is shown in sections in FIGS. 12 and 13. As shown in FIGS. 12 and 13, the locking members 21 of the front housing 13 and the engagement pins 36 are disposed so that they can engage with each other.

Figure 14A:
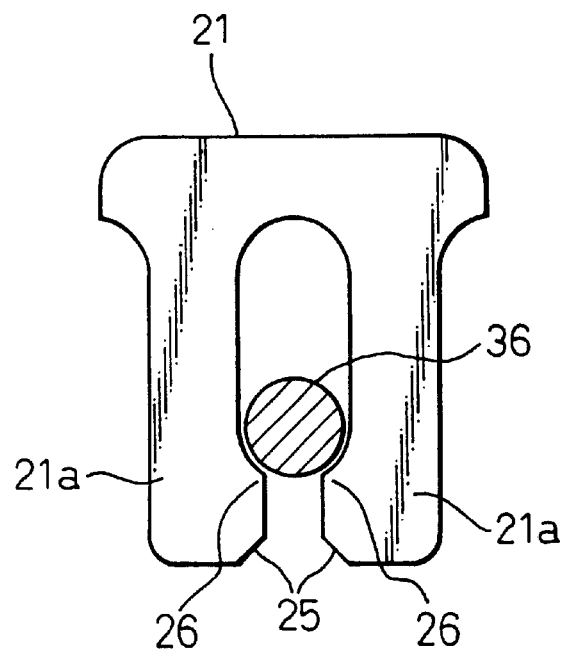
FIG. 14A illustrates the engagement between the locking member and the engagement pin.

FIG. 14A illustrates the engagement between the locking member 21 and the engagement pin 36. When the front housing 13 approaches the rear housing 14 as shown in FIGS. 12 and 13, the cutout portions 25 at the distal end of the arms 21a contact the engagement pin 36. A further approach of the front housing 13 moves the arms 21a away from each other so that the pin 36 introduced inside of the engagement surfaces 26 to lock the front housing 13 to the rear housing 14.

The cutout portions 25 are provided at the distal ends of the arms 21a to define substantially 90 degrees therebetween so that the engagement between the locking members 21 and the engagement pins 36 easily moves the arms 21a away from each other. In this embodiment, the cutout portions 25 are plain while another configuration, which enables the engagement between the locking members 21 and the engagement pins 36 to move the arms 21a away from each other, are also within the scope of the invention.

The engagement surfaces 26 have a rounded configuration to mate the surface of the pins 36. The configuration of the engagement surfaces 26 allows the locking member 21 to engage the pins 36 as well as to release them when the front housing 13 is forced away from the rear housing 14.

This feature of the locking arrangement of the invention allows an person to assemble and disassemble the housing of the bar code reader without a tools such as driver. In particular, during disassembling the housing 1, the locking members 22 can be released from the engagement pins 36 by only forcing the front housing 13 from the rear housing 14.

Figure 14B:
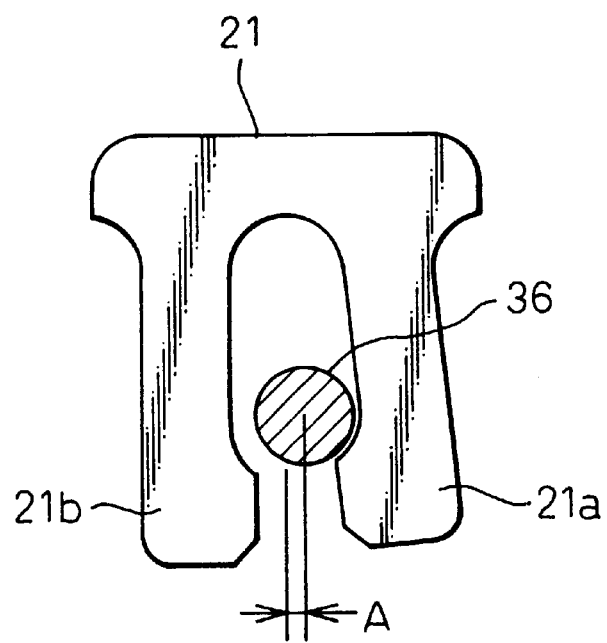
FIG. 14B is an illustration similar to FIG. 14A, in which the locking member and the engagement pin are disposed in misalignment.
Figure 26A:
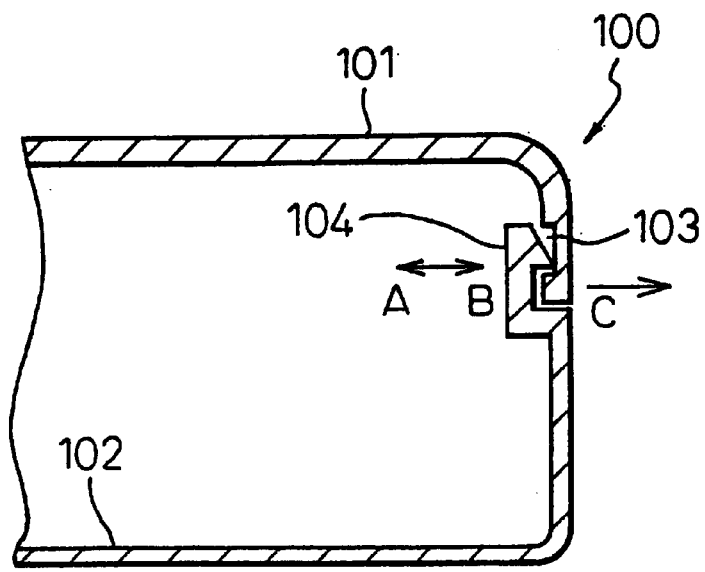
FIG. 26A is a partial section of a housing illustrating an example of a locking arrangement of the prior art.
Figure 26B:
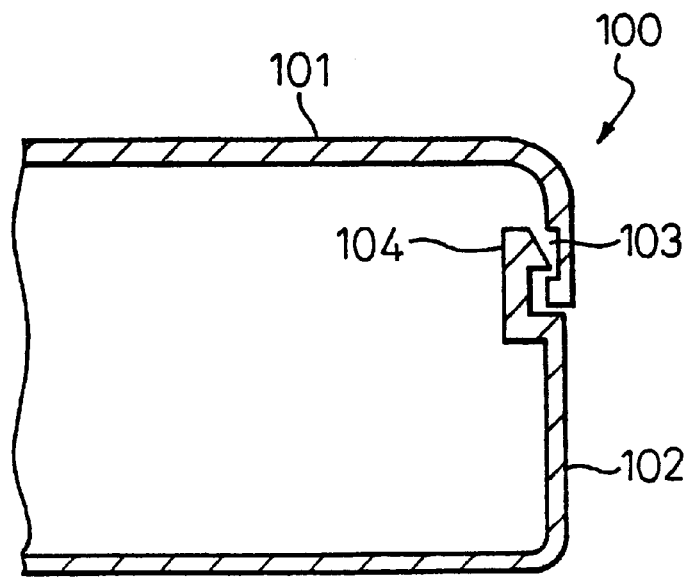
FIG. 26B is a partial section of a housing similar to FIG. 25A illustrating the problem of the prior art.

Further, the locking members 21 can hold the engagement pins 36 if the locking members 21 and pins 36 are not disposed accurately relative to each other since the locking members 21 engage both sides of the pins 36 and the arms 21a have flexibility. With reference to FIG. 14B, the engagement pin 36 are misaligned to the locking member 21 by a distance A from the center thereof. In this case, the right arm 21a in the drawing can engage and hold the pin 36. In addition to this, the length of the engagement pins 36 are selected so that the locking members 21 and the engagement pins 36 can engage with each other if the locking members 21 are deviated from the accurate position in the longitudinal direction of the pins 36. On the other hand, in the claw and recess configuration of the prior art shown in FIGS. 26A and 26B, a slight error in the dimension or position may stop the front and rear housings contacting.

Figure 15A:
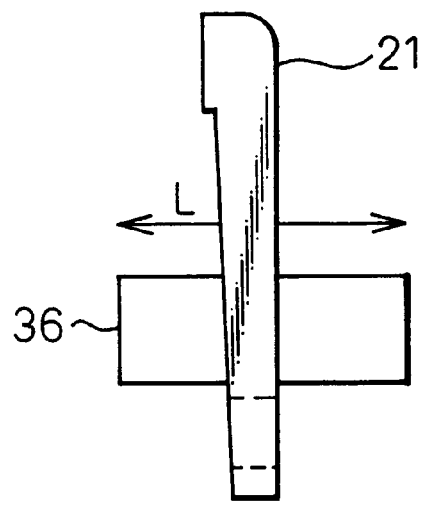
FIG. 15A is a side view of the locking member and engagement pin engaging with each other.

FIG. 15A is a side view of the locking member 21 and engagement pin 36 which engage with each other. The locking member 21 engages only a small portion of the pin 36 so that the pin 36 has a sufficient length L in the longitudinal direction. The length ensures the engagement between the locking members 21 and the pins 36 if the locking members 21 are deviated from the accurate position in the longitudinal direction.

As described above, the locking arrangement of the invention ensures the engagement between the locking members 21 and the pins 36 if they are have an error in the dimension or position.

Figure 15B:
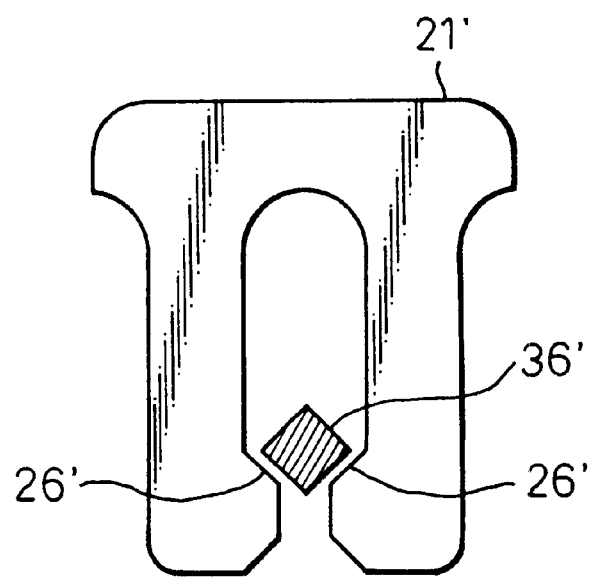
FIG. 15B illustrates the engagement between the locking member and the engagement pin, according to another embodiment of the invention.

According to another embodiment shown in FIG. 15B, the locking member 21 engages an engagement pin 36' which has a square section. In this embodiment, the engagement surfaces 26' have flat surfaces which mate the side surfaces of the square pin 36'. This embodiment also allows the locking member 21 to separate from the pins 36' easily.

FIGS. 16 to 20 illustrate the assembling of the housing 1 of the bar code reader according to the embodiment of the invention. In these drawings, the optical and electrical units of the bar code reader are not shown.

First, the front and rear housings 13 and 14 are connected to each other as shown by arrows X to define the housing 1. Then, the housing 1 is mounted to a table such as a top of a cashier's counter (not shown) through the mounting member 41, which is secured to a top of a table 70, to prevent the bar code reader from falling. The mounting member 41 is a L shaped metallic sheet including horizontal and vertical portions 41a and 41b. The horizontal portion 41a includes four apertures 42 for threading screws, and the positioning tab 44 parallel to the vertical portion 41b.

The vertical portion of mounting member 41 is inserted into the guide gaps 35 in the recess 31 through the bottom portion of the opening 39. Further, the positioning tab 44 is inserted into the rectangular opening 40 to position the housing 1 relative to the mounting member 41. The vertical portion 41b of the mounting member 41 includes a slot 43 for avoiding interference between the boss 34 and the vertical portion 41b of the mounting member 41.

FIG. 21 shows the vertical portion 41a of the mounting member 41 inserted into the recess 31. Guide members 32 hold the vertical portion 41a. The vertical portion 41a includes an aperture 45 through which a screw (not shown) is threaded into the rear housing 14 to fasten the rear housing 14 to the mounting member 41. The vertical portion 41a of the mounting member 41 has a height substantially same as the location where the opening 37 is provided.

FIG. 22 is an enlarged sectional illustration of the recess 31 with the vertical portion 41a inserted into the guide gaps 35 between the guide members 32 and the partition 14c in the recess 31. The connector 52 is mounted to the rear housing by a bracket 51 made of sheet metal. The bracket 51 contacts the mounting member 41 to provide electrical conductivity therebetween.

Figure 23:
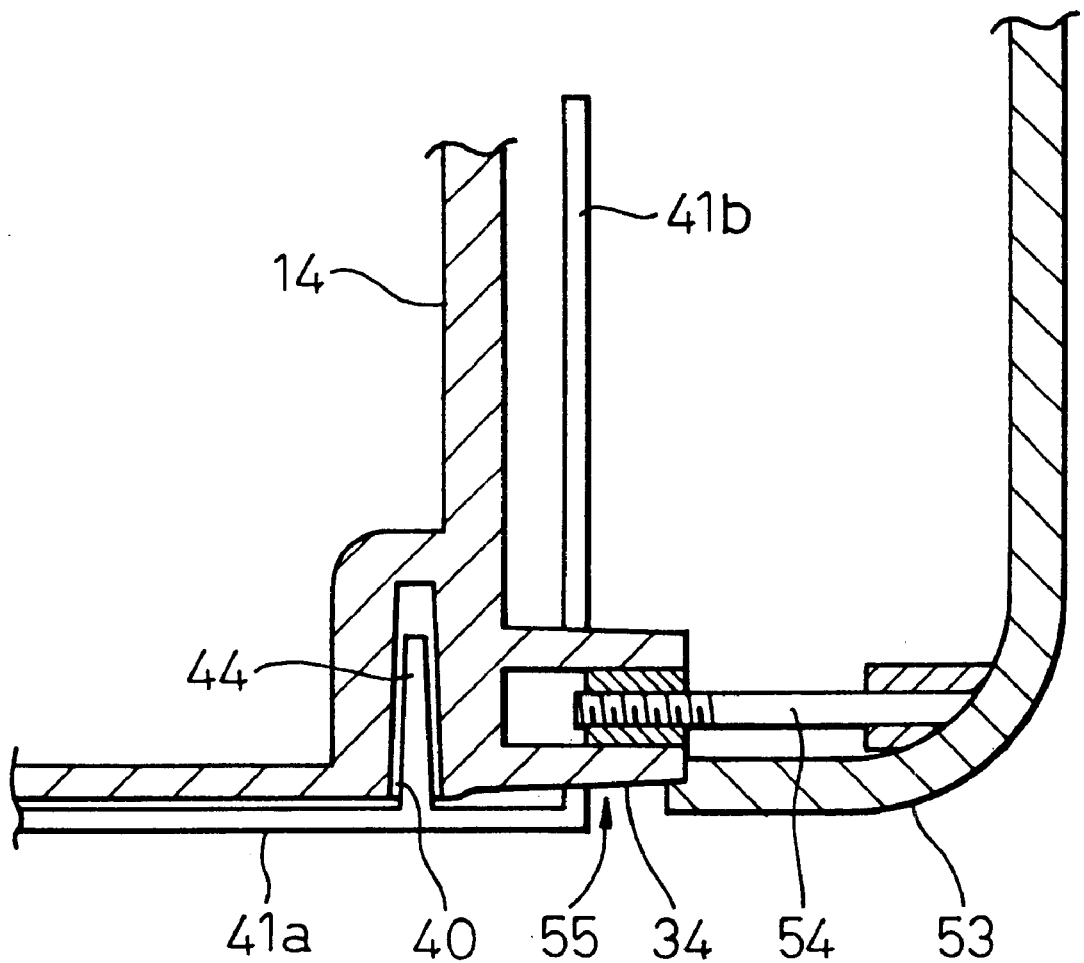
FIG. 23 is a partially enlarged side section of the bottom portion of the rear housing illustrating the attachment of the rear cover to the recess of the rear housing.

With reference to FIG. 23, the cover 53 is attached to the rear housing by screw 54 to close the opening 39. If the rear housing 14 is not secured to the mounting member 41, the screw 43 prevents the housing 1 from being completely removed from the mounting member 41 by engaging the slot 43.

According to the embodiment, only the mounting member 41 can be secured to the top of the table 70, such as a top of a cashier's counter, separately from the bar code reader. This enables the installation of the bar code by only one person. On the other hand, if a mounting member is adapted to be secured to a bar code reader, a heavy reader cannot be secured to a table by only one person. Thus, the mounting configuration of the invention improves the efficient of mounting of the bar code reader.

Figure 24:
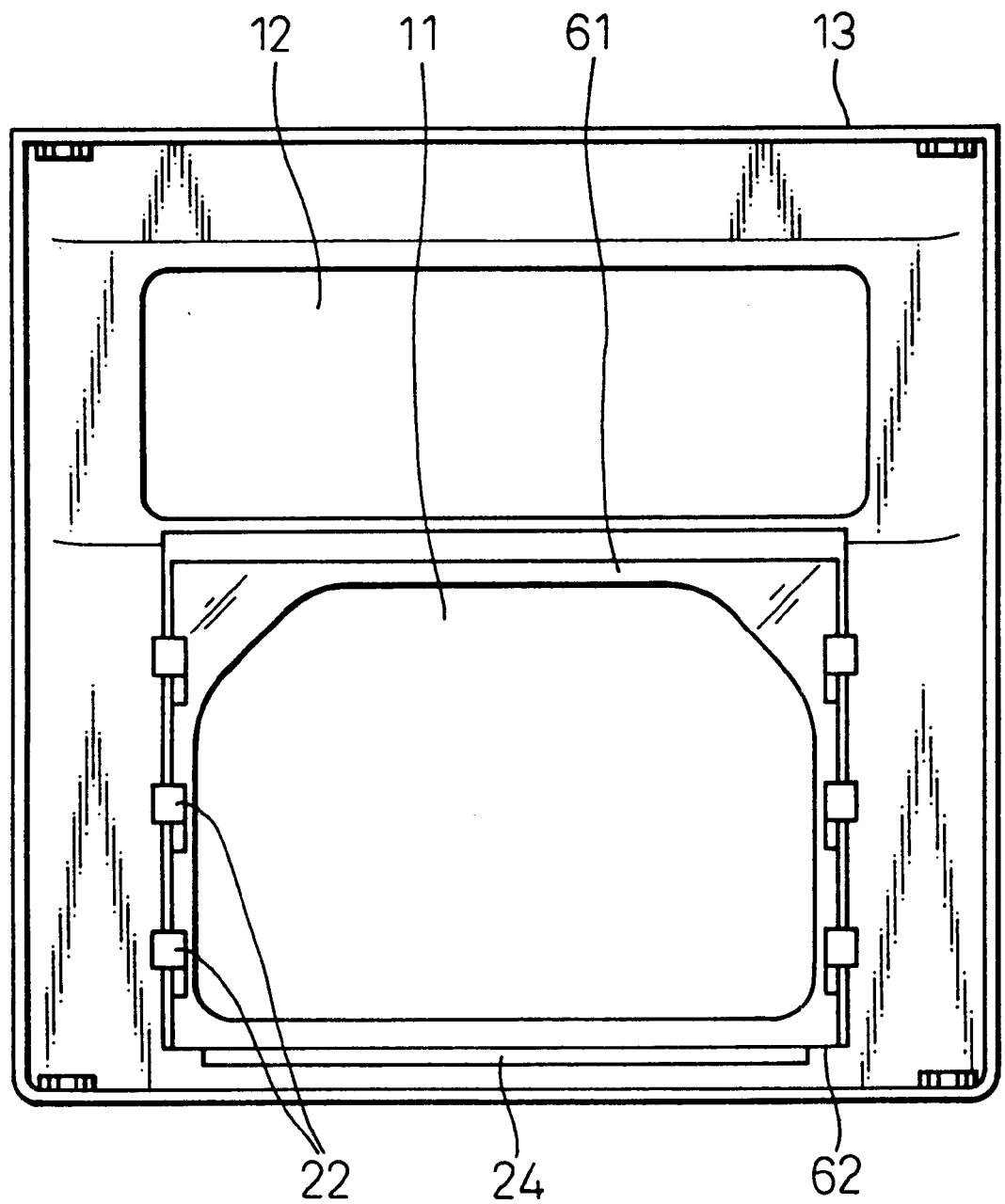
FIG. 24 is a back view of the front housing illustrating the glass plate mounted to the inner surface of the front housing over the first window.

With reference to FIG. 24, the glass plate 61, which is made of a hard glass such as sapphire glass, is mounted to the inner surface of the front housing 13 over the first window 11 by the catches 22. As described above, the bar code reader is mounted to a table in an upright position. An article, to which a bar code is applied, is passed across the front of the bar code reader to read the bar code. As it passes, the article may contact the glass plate 61 which results in scratches on the surface of the glass plate 61. The scratches on the glass plate 61 deteriorates the bar code reading ability of the reader so that replacement of the glass plate 61 is essential for the bar code reader.

According to the embodiment, the glass plate 61 is detachably mounted on the inner surface of the front housing 13 by the catches 22. The stopper 24 abuts the lower end of the glass plate 61 to support it.

Figure 25A:
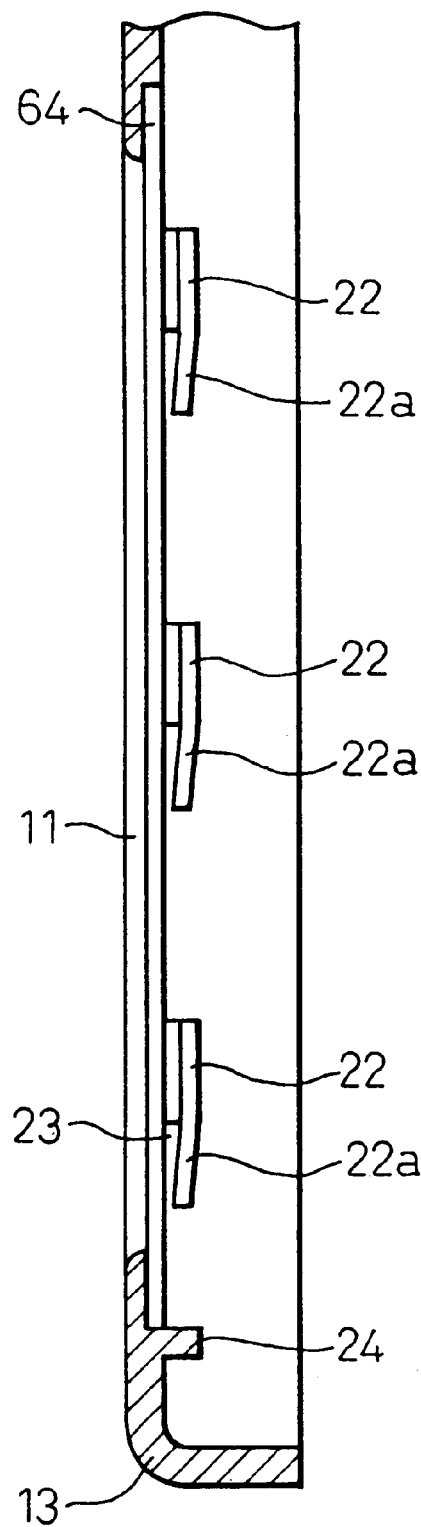
FIG. 25A is a partially enlarged side section of the front housing around the first window illustrating the catches with the glass plate removed.
Figure 25B:
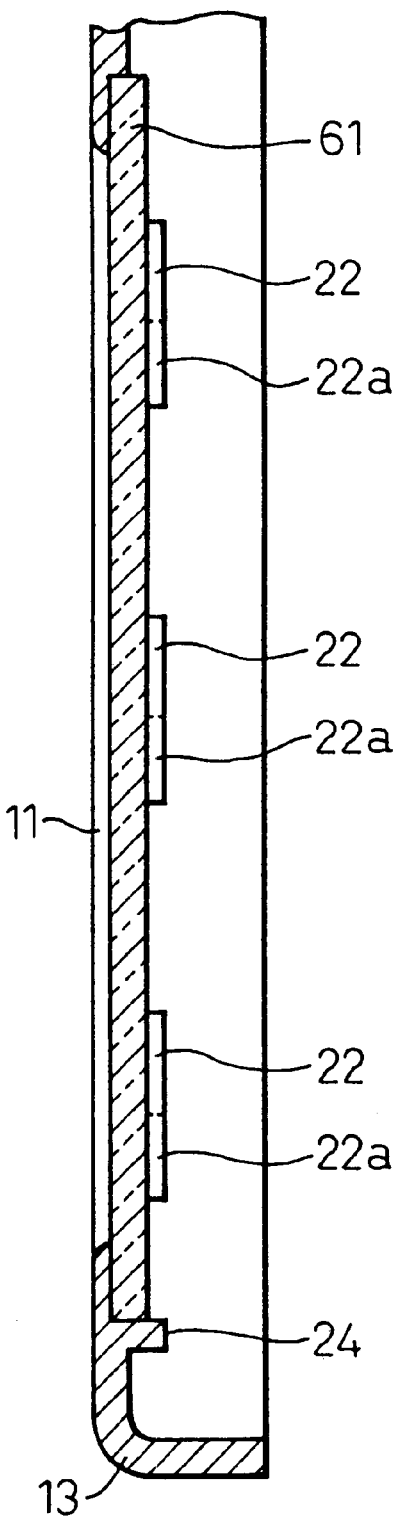
FIG. 25B is a partially enlarged side section similar to FIG. 25A, illustrating the catches with the glass plate mounted.

FIGS. 25A and 25B are partially enlarged side section of the front housing 13 around the first window 11 and the catches 22, the glass plate 61 being removed in FIG. 25A, and the glass plate 61 being mounted in FIG. 25B. As shown in FIGS. 25A and 25B, the catches 22 are flexible so that the distal ends 22a of the catches 22 bend toward the outside of the front housing 13 when the glass plate is removed, and the ends 22a straighten when the glass plate 61 is mounted. Thus, the catches 22 resiliently hold the glass plate 61. In the particular embodiment shown in FIGS. 25A and 25B, the front housing 13 further includes a recess into which the glass plate 61 is fitted.

It will also be understood by those skilled in the art that the forgoing description is a preferred embodiment of the disclosed device and that various changes and modifications may be made without departing from the spirit and scope of the invention.

We claim:

1. An arrangement for mounting a housing to a table, the housing including a recess for containing a cable and connector assembly for transmitting an electrical signal to an outside mainframe, the recess including an opening for accessing the cable and connector, the opening being adapted to be closed by a cover, the cover being secured to the housing by a screw, the arrangement comprising:

a mounting member including a first wall adapted to be inserted into the recess of the housing and to be secured to the housing, and a second wall adapted to be secured to the table, the first and second walls being connected to each other, the mounting member including a slot for avoiding interference between the screw and the first wall of the mounting member; and a guide, provided in the housing, for guiding the first wall inserted into the housing.

2. An arrangement, according to claim 1, in which the first and second walls are connected perpendicularly to each other.

3. An arrangement, according to claim 2, in which the mounting member further includes a positioning tab provided on the second wall parallel to the first wall; and the housing including an opening for receiving the positioning tab.

* * * * *